United States Patent
Saxler

(10) Patent No.: US 7,170,111 B2
(45) Date of Patent: Jan. 30, 2007

(54) NITRIDE HETEROJUNCTION TRANSISTORS HAVING CHARGE-TRANSFER INDUCED ENERGY BARRIERS AND METHODS OF FABRICATING THE SAME

(75) Inventor: Adam William Saxler, Durham, NC (US)

(73) Assignee: Cree, Inc., Durham, NC (US)

( * ) Notice: Subject to any disclaimer, the term of this patent is extended or adjusted under 35 U.S.C. 154(b) by 150 days.

(21) Appl. No.: 10/772,882

(22) Filed: Feb. 5, 2004

(65) Prior Publication Data

US 2005/0173728 A1    Aug. 11, 2005

(51) Int. Cl.
    *H01L 31/0304*    (2006.01)
(52) U.S. Cl. .............................. 257/194; 257/E29.251
(58) Field of Classification Search ................ 257/194, 257/E29.251
    See application file for complete search history.

(56) References Cited

U.S. PATENT DOCUMENTS

| | | | |
|---|---|---|---|
| 4,424,525 A | 1/1984 | Mimura ........................ 357/23 |
| 4,471,366 A | 9/1984 | Delagebeaudeuf et al. ... 357/16 |
| 4,727,403 A | 2/1988 | Hilda et al. .................... 357/22 |
| 4,755,867 A | 7/1988 | Cheng |
| 4,788,156 A | 11/1988 | Stoneham et al. |
| 4,946,547 A | 8/1990 | Palmour et al. ............ 156/643 |
| 5,053,348 A | 10/1991 | Mishra et al. |
| 5,172,197 A | 12/1992 | Nguyen et al. |
| 5,192,987 A | 3/1993 | Khan et al. ................ 257/183.1 |
| 5,200,022 A | 4/1993 | Kong et al. ................ 156/612 |
| 5,210,051 A | 5/1993 | Carter, Jr. .................... 437/107 |
| 5,292,501 A | 3/1994 | Degenhardt et al. .......... 424/49 |
| 5,296,395 A | 3/1994 | Khan et al. ................... 437/40 |
| 5,298,445 A | 3/1994 | Asano |
| RE34,861 E | 2/1995 | Davis et al. ................. 437/100 |
| 5,389,571 A | 2/1995 | Takeuchi et al. |
| 5,393,993 A | 2/1995 | Edmond et al. ............... 257/77 |
| 5,523,589 A | 6/1996 | Edmond et al. ............... 257/77 |
| 5,534,462 A | 7/1996 | Fiordalice et al. |
| 5,592,501 A | 1/1997 | Edmond et al. .............. 372/45 |

(Continued)

FOREIGN PATENT DOCUMENTS

EP    0 334 006 A1    9/1989

(Continued)

OTHER PUBLICATIONS

Adeside et al "AlGaN/GaN . . . Applications", Proc. 6th Int. Conf. Solid-State and Int. Cir. Tech. vol. 2 pp. 1163-1168 Oct. 22-25, 2001.*
Chen et al, "High-Transconductance . . . MOVPE", IEEE Elec. Dev. Lett. vol. 10 No. 4 Apr. 1989, pp. 162-164.*
Wang et al, "Modfet . . . Effects", IEEE Trans. Elec. Dev. vol. 36 No. 9 Sep. 1989, pp. 1847-1850.*

(Continued)

*Primary Examiner*—Jerome Jackson
(74) *Attorney, Agent, or Firm*—Myers Bigel Sibley & Sajovec, PA

(57) ABSTRACT

A nitride-based field effect transistor includes a substrate, a channel layer comprising InAlGaN formed on the substrate, source and drain ohmic contacts in electrical communication with the channel layer, and a gate contact formed on the channel layer. At least one energy barrier opposes movement of carriers away from the channel layer. The energy barrier may comprise an electron source layer in proximity with a hole source layer which generate an associated electric field directed away from the channel. An energy barrier according to some embodiments may provide a built-in potential barrier in excess of about 0.5 eV. Method embodiments are also disclosed.

19 Claims, 9 Drawing Sheets

U.S. PATENT DOCUMENTS

| | | | |
|---|---|---|---|
| 5,686,737 | A | 11/1997 | Allen |
| 5,700,714 | A | 12/1997 | Ogihara et al. |
| 5,701,019 | A | 12/1997 | Matsumoto et al. ........ 257/192 |
| 5,705,827 | A | 1/1998 | Baba et al. .................... 257/46 |
| 5,804,482 | A | 9/1998 | Konstantinov et al. |
| 5,885,860 | A | 3/1999 | Weitzel et al. |
| 5,946,547 | A | 8/1999 | Kim et al. |
| 5,990,531 | A | 11/1999 | Taskar et al. |
| 6,028,328 | A | 2/2000 | Riechert et al. |
| 6,046,464 | A | 4/2000 | Schetzina .................... 257/96 |
| 6,064,082 | A | 5/2000 | Kawai et al. ............... 257/192 |
| 6,086,673 | A | 7/2000 | Molnar |
| 6,150,680 | A | 11/2000 | Eastman et al. ............ 257/224 |
| 6,177,685 | B1 | 1/2001 | Teraguchi et al. ............ 257/20 |
| 6,218,680 | B1 | 4/2001 | Carter, Jr. et al. ............ 257/77 |
| 6,316,793 | B1 | 11/2001 | Sheppard .................... 257/103 |
| 6,429,467 | B1 | 8/2002 | Ando ........................ 257/194 |
| 6,448,648 | B1 | 9/2002 | Boos |
| 6,492,669 | B2 | 12/2002 | Nakayama et al. |
| 6,515,316 | B1 | 2/2003 | Wojtowicz et al. ......... 257/194 |
| 6,548,333 | B2 | 4/2003 | Smith ......................... 438/172 |
| 6,586,781 | B2 | 7/2003 | Wu et al. |
| 6,639,255 | B2 | 10/2003 | Inoue et al. |
| 2001/0015446 | A1 | 8/2001 | Inoue et al. ................ 257/192 |
| 2001/0020700 | A1 | 9/2001 | Inoue et al. .................. 257/20 |
| 2001/0023964 | A1 | 9/2001 | Wu et al. ................... 257/368 |
| 2001/0040246 | A1 | 11/2001 | Ishii |
| 2002/0008241 | A1 | 1/2002 | Edmond et al. |
| 2002/0017696 | A1 | 2/2002 | Nakayama et al. ......... 257/471 |
| 2002/0066908 | A1 | 6/2002 | Smith |
| 2002/0079508 | A1 | 6/2002 | Yoshida |
| 2002/0119610 | A1 | 8/2002 | Nishii et al. |
| 2002/0167023 | A1 | 11/2002 | Chavarkar et al. .......... 257/194 |
| 2003/0017683 | A1 | 1/2003 | Emrick et al. |
| 2003/0020092 | A1 | 1/2003 | Parikh et al. |
| 2003/0102482 | A1 | 6/2003 | Saxler ......................... 257/85 |
| 2003/0123829 | A1 | 7/2003 | Taylor ....................... 385/131 |
| 2003/0145784 | A1 | 8/2003 | Thompson et al. |
| 2003/0157776 | A1 | 8/2003 | Smith |
| 2003/0213975 | A1 | 11/2003 | Hirose et al. |
| 2004/0004223 | A1 | 1/2004 | Nagahama et al. |
| 2004/0021152 | A1 | 2/2004 | Nguyen et al. |
| 2004/0029330 | A1 | 2/2004 | Hussain et al. |
| 2004/0066908 | A1 | 4/2004 | Saxler et al. |
| 2004/0241970 | A1 | 12/2004 | Ring |

FOREIGN PATENT DOCUMENTS

| | | |
|---|---|---|
| EP | 0 563 847 A2 | 10/1993 |
| JP | 10-050982 | 2/1998 |
| JP | 11261053 | 9/1999 |
| JP | 02001230407 A | 8/2001 |
| JP | 02002016087 | 1/2002 |
| JP | 2004-342810 | 12/2004 |
| WO | WO 93/23877 A1 | 11/1993 |
| WO | WO 01/57929 A1 | 8/2001 |
| WO | WO 03/049193 A1 | 6/2003 |
| WO | 2004/008495 A2 | 1/2004 |
| WO | 2004/008495 A3 | 1/2004 |

OTHER PUBLICATIONS

Asbeck et al. "Piezoelectric charge densities in AlGaN/GaN HFETs," *Electronics Letters*. vol. 33, No. 14, pp. 1230-1231, 1997.

Eastman et al. "GaN materials for high power microwave amplifiers," *Mat. Res. Soc. Symp. Proc.* vol. 512 (1998).

Eastman et al. "Undoped AlGaN/GaN HEMTs for Microwave Power Amplification," *IEEE Transactions on Electron Devices*. vol. 48, No. 3, Mar. 2001, pp. 479-485.

Gaska et al. "Electron Transport in AlGaN-GaN Heterostructures Grown on 6H-SiC Substrates," Appl.Phys.Lett., 72, 707 (1998).

Gaska et al. "High-Temperature Performance of AlGaN/GaN HFET's on SiC Substrates," *IEEE Electron Device Letters*. vol. 18; No. 1, p. 492, Oct. 1997.

Gelmont et al. "Monte Carlo simulation of electron transport in gallium nitride," J.Appl.Phys. 74, 1818 (1993).

Heikman et al., Growth of Fe-Doped Semi-insulating GaN by Metalorganic Chemical Vapor Deposition, Appl. Phys. Let. 81, pp. 439-441 (2002).

Ping et al. "DC and Microwave Performance of High-Current AlGaN/GaN Heterostructure Field Effect Transistors Grown on P-Type SiC Substrates," *IEEE Electron Letters*. vol. 19, No. 2, p. 54, Feb. 1998.

Sheppard et al. "High Power Demonstration at 10 GHz with GaN/AlGaN HEMT Hybrid Amplifiers." Presented at the 58th DRC, Denver, CO, Jun. 2000.

Sheppard et al. "Improved 10-GHz Operation of GaN/AlGaN HEMTs on Silicon Carbide," *Materials Science Forum*. (2000) vols. 338-342, pp. 1643-1646.

Sheppard et al. U.S. Appl. No. 09/096,967, entitled, *Nitride Based Transistors On Semi-Insulating Silicon Carbide Substrates*, filed Jun. 12, 1998.

Sullivan et al. "High-Power 10-GHz Operation of AlGaN HFET's in Insulating SiC," *IEEE Electron Device Letters*. vol. 19, No. 6, p. 198, Jun. 1998.

Wu et al. "High Al-Content AlGaN/GaN MODFET's for Ultrahigh Performance," *IEEE Electron Device Letters*. vol. 19, No. 2, p. 50, Feb. 1998.

Yu et al. "Schottky barrier engineering in III-V nitrides via the piezoelectric effect," *Applied Physics Letters*. vol. 73, No. 13, pp. 1880-1882, Sep. 28, 1998.

International Search Report for PCT/US02/09398, Aug. 26, 2002.

United States Patent Application entitled "Co-Doping for Fermi Level Control in Semi-Insulating Group III Nitrides", filed Jan. 7, 2004.

Ben-Yaacov et al., "AlGaN/GaN Current Aperture Vertical Electron Transistors with Regrown Channels," *Journal of Applied Physics*. vol. 95, No. 4, pp. 2073-2078 (2004).

Burm et al. "Ultra-Low Resistive Ohmic Contacts on n-GaN Using Si Implantation," *Applied Physics Letters*. vol. 70, No. 4, 464-66 (1997).

Heikman, et al., "Mass Transport Regrowth of GaN for Ohmic Contacts to AlGaN/GaN," *Applied Physics Letters*. vol. 78, No. 19, pp. 2876.

Shen et al., "High-Power Polarization-Engineered GaN/AlGaN/GaN HEMTs Without Surface Passivation," *IEEE Electronics Device Letters*. vol. 25, No. 1, pp. 7-9 (2004).

United States Patent Application entitled "Nitride-Based Transistors with a Protective Layer and a Low-Damage Recess and Methods of Fabrication Thereof," U.S. Appl. No. 10/758,871, filed Jan. 16, 2004.

United States Patent Application entitled "Semiconductor Devices Having a Hybrid Channel Layer, Current Aperture Transistors and Methods of Fabricating the Same," U.S. Appl. No. 10/849,589, filed May 20, 2004.

United States Patent Application entitled "Methods of Fabricating Nitride-Based Transistors Having Regrown Ohmic Contact Regions and Nitride-Based Transistors Having Regrown Ohmic Contact Regions," U.S. Appl. No. 10/849,617, filed May 20, 2004.

United States Patent Application entitled "Methods of Fabricating Nitride-Based Transistors with a Cap Layer and a Recessed Gate," filed Jul. 23, 2004.

United States Patent Application entitled "Methods of Having Laterally Grown Active Region and Methods of Fabricating Same," filed Jul. 26, 2004.

United States Patent Application entitled, "Silicon Carbide on Diamond Substrates and Related Devices and Methods,".

Chang et al., "AlGaN/GaN Modulation-Doped Field-Effect Transistors with an Mg-doped Carrier Confinement Layer," *Jpn. J. Appl. Phys.*, 42:3316-3319 (2003).

Cho et al., "A New GaAs Filed Effect Transistor (FET) with Dipole Barrier (DIB)," *Jpn. J. Appl. Phys*. 33:775-778 (1994).

Coffie et al., Unpassivated p-GaN/AlGaN/GaN HEMTs with 7.1 W/MMF at 10 GHz, *Electronic Letters online No. 20030872*, 39(19), (Sep. 18, 2003).

Küsters et al. "Double-Heterojunction Lattice-Matched and Pseudomorphic InGaAs HEMT with δ-Doped InP Supply Layers and p-InP Barier Enhancement Layer Grown by LP-MOVPE," *IEEE Electron Device Letters*, 14(1), (Jan. 1993).

Shiojima et al., "Improved Carrier Confinement by a Buried p-Layer in the AlGaN/GaN HEMT Structure," *IEICE Trans. Electron.*, E83-C(12), (Dec. 2000).

International Search Report and Written Opinion of the International Searching Authority for PCT US2004/031984; date of mailing Jan. 21, 2005.

Ando et al., "10-W/mm AlGaN-GaN HFET With a Field Modulating Plate," *IEEE Electron Device Letters*, 24(5), pp. 289-291 (May 2003).

Chini et al., "Power and Linearity Characteristics of Field-Plagted Recessed-Gate AlGaN-GaN HEMTs," *IEEE Electron Device Letters*, 25(5), pp. 229-231 (May 2004).

Gaska et al., "Self-Heating in High-Power AlGaN/GaN HFET's," *IEEE Electron Device Letters*, 19(3), pp. 89-91 (Mar. 1998).

Hikita et al., "350V/150A AlGaN/GaN Power HFET on Silicon Substrate With Source-via Grouding (SVG) Structure," *Electron Devices Meeting*, 2004, pp. 803-806, IEDM Technical Digest. IEEE International (Dec. 2004).

Kanaev et al., "Femtosecond and Ultraviolet Laser Irradiation of Graphitelike Hexagonal Boron Nitride," *Journal of Applied Physics*, 96(8), pp. 4483-4489 (Oct. 15, 2004).

Kanamura et al., "A 100-W High-Gain AlGaN/GaN HEMT Power Amplifier on a Conductive N-SiC Substrate for Wireless Base Station Applications," *Electron Devices Meeting*, 2004, pp. 799-802, IEDM Technical Digest. IEEE International (Dec. 2004).

Karmalkar et al., "Very High Voltage AlGaN/GaN High Electron Mobility Transistors Using a Field Plate Deposited on a Stepped Insulator," *Solid State Electronics*, vol. 45, pp. 1645-1652 (2001).

Kashahara et al., "Ka-ban 2.3W Power AlGaN/GaN Heterojunction FET," *IEDM Technical Digest*, pp. 677-680 (2002).

Komiak et al., "Fully Monolithic 4 Watt High Efficiency Ka-band Power Amplifier," *IEEE MTT-S International Microwave Symposium Digest*, vol. 3, pp. 947-950 (1999).

Manfra et al., "Electron Mobility Exceeding 160 000 $cm^2/V$ s in AlGaN/GaN Heterostructures Grown by Molecular-beam Epitaxy," *Applied Physics Letters*, 85(22), pp. 5394-5396 (Nov. 29, 2004).

Manfra et al., "High Mobility AlGaN/GaN Heterostructures Grown by Plasma-assisted Molecular beam epitaxy on Semi-Insulating GaN Templates Prepared by Hydride Vapor Phase Epitaxy," *Journal of Applied Physics*, 92(1), pp. 338-345 (Jul. 1, 2002).

Manfra et al., "High-Mobility AlGaN/GaN Heterostructures Grown by Molecular-beam Epitaxy on GaN Templates Prepared by Hydride Vapor Phase Epitaxy," *Applied Physics Letters*, 77(18), pp. 2888-2890 (Oct. 30, 2000).

Parikh et al., "Development of Gallium Nitride Epitaxy and Associated Material-Device Correlation for RF, Microwave and MM-wave Applications," Cree, Inc. (35 slides).

Saxler et al., "III-Nitride Heterostructures on High-Purity Semi-Insulating 4H-SiC Substrates for High-Power RF Transistors," International Workshop on Nitride Semiconductors (Jul. 19, 2004).

"Thick AlN template on SiC substrate—Novel semi insulating substrate for GaN-based devices," © 2003 by TDI, Inc., http://www.tdii.com/products/AIN_SiCT.html.

Tilak et al., "Influence of Barrier Thickness on the High-Power Performance of AlGaN/GaN HEMTs," *IEEE Electron Device Letters*, 22(11), pp. 504-506 (Nov. 2001).

United States Patent Application entitled "Improved Dielectric Passivation for Semiconductor Devices," U.S. Appl. No. 10/851,507, filed May 22, 2004.

United States Patent Application entitled "Silicon Carbide on Diamond Substrates and Related Devices and Methods," U.S. Appl. No. 10/707,898, filed Jan. 22, 2004.

United States Patent Application entitled "Methods of Fabricating Nitride-Based Transistors with a Cap Layer and a Recessed Gate," U.S. Appl. No. 10/897,726, filed Jul. 23, 2004.

United States Patent Application entitled "High Power Density and/or Linearity Transistors," U.S. Appl. No. 11/005,107, filed Dec. 6, 2004.

United States Patent Application entitled "Field Effect Transistors (FETS) Having Multi-Watt Output Power at Millimeter-Wave Frequencies," U.S. Appl. No. 11/005,423, filed Dec. 6, 2004.

United States Patent Application entitled "Group III Nitride Field Effect Transistors (FETs) Capable of Withstanding High Temperature Reverse Bias Test Conditions," U.S. Appl. No. 11/080,905, filed Mar. 15, 2005.

United States Patent Application entitled "Aluminum Free Group III-Nitride Based High Electron Mobility Transistors and Methods of Fabricating Same," U.S. Appl. No. 11/118,575, filed Apr. 29, 2005.

United States Patent Application entitled "Binary Group III-Nitride Based High Electron Mobility Transistors and Methods of Fabricating Same," U.S. Appl. No. 11/118,675, filed Apr. 29, 2005.

United States Patent Application entitled "Composite Substrates of Conductive And Insulating or Semi-Insulating Group III-Nitrides For Group III-Nitride Devices," U.S. Appl. No. 11/103,127, filed Apr. 11, 2005.

United States Patent Application entitled "Thick Semi-Insulating or Insulating Epitaxial Gallium Nitride Layers and Devices Incorporating Same," U.S. Appl. No. 11/103,117, filed Apr. 11, 2005.

United States Patent Application entitled "Cap Layers and/or Passivation Layers for Nitride-Based Transistors, Transistor Structures and Methods of Fabricating Same," U.S. Appl. No. 10/996,249, filed Nov. 23, 2004.

Walker, J. L. B. (Ed.), *High Power GaAs FET Amplifiers*, Norwood, MA: Artech House, pp. 119-120 (1993).

Wu et al., "3.5-Watt AlGaN/GaN HEMTs and Amplifiers at 35 GHz," IEDM-2003, Cree, Inc.

Wu et al., "3.5-Watt AlGaN/GaN HEMTs and Amplifiers at 35 GHz," Cree Santa Barbara Technology Center, Goleta, CA 93117.

Wu et al., "30-W/mm GaN HEMTs by Field Plate Optimization," *IEEE Electron Device Letters*, 25(3), pp. 117-119 (Mar. 2004).

Wu et al., "Bias-dependent Performance of High-Power AlGaN/GaN HEMTs," *IEDM Technical Digest*, p. 378-380 (2001).

Wu et al., "Linearity Performance of GaN HEMTs With Field Plates," DRC 2004, Cree, Inc.

Wu et al., "Linearity Performance of GaN HEMTs With Field Plates," Cree Santa Barbara Technology Center, Goleta, CA 93117.

Yu et al., "Schottky Barrier Engineering in III-V Nitrides via the Piezoelectric Effect," *Applied Physics Letters*, 73(13), pp. 1880-1882 (Sep. 28, 1998).

Zhang et al., "High Breakdown GaN HEMT with Overlapping Gate Structure," *IEEE Electron Device Letters*, 21(9), pp. 421-423 (Sep. 2000).

Breitschadel et al., "Minimization of Leakage Current of Recessed Gate AlGaN/GaN HEMTs by Optimizing the Dry-Etching Process," *Journal of Electronic Materials*, vol. 28, No. 12 (1999).

Burm et al., "Recessed Gate GaN MODFETS," *Solid State Electronics*, vol. 41, No. 2, pp. 247-250 (1997).

Chen et al., "Reactive ion etching for gate recessing of AlGaN/GaN Field-effect transistors," *J. Vac. Sci. Technol. B*, vol. 17, No. 6, (1999).

Egawa et al., "Recessed gate AlGaN/GaN modulation-doped filed-effect transistors on sapphire," *Applied Physics Letters*, vol. 76, No. 1, pp. 121-123 (2000).

Heikman et al., "Polarization Effects in AlGaN/GaN and GaN/AlGaN/GaN heterostructures," *Journal of Applied Physics*, vol. 93, No. 12, pp. 10114-10118 (2003).

Heikman, Sten J., *MOCVD Growth Technologies for Applications in AlGaN/GaN High Electron Mobility Transistors*, Dissertation, University of California—Santa Barbara, 190 pages (2002).

Karmalkar et al., "Enhancement of Breakdown Voltage in AlGaN/GaN High Electron Mobility Transistors Using A Field Plate," *IEEE Transactions on Electron Devices*, vol. 48, No. 8 (2001).

Karmalkar et al., "RESURF AlGaN/GaN HEMT for High Voltage Power Switching," *IEEE Electron Device Letters*, vol. 22, No. 8, pp. 373-375 (2001).

Kuzmik et al., "Annealing of Schottky contacts deposited on dry etched AlGaN/GaN," *Semiconductor Science and Technology*, vol. 17, No. 11 (2002).

Neuburger et al. "Design of GaN-based Field Effect Transistor Structures based on Doping Screening of Polarization Fields," WA 1.5, 7th Wide-Bandgap III-Nitride Workshop, Mar. 2002.

Sriram et al., "RF Performance of AlGaN/GaN MODFET's on High Resistivity SiC Substrates," Presentation at Materials Research Society Fall Symposium, 1997.

Sriram et al., "SiC and GaN Wide Gandgap Microwave Power Transistors," *IEEE Samoff Symposium*, Mar. 18, 1998.

Ambacher et al., "Two Dimensional Electron Gases Induced by Spontaneous and Piezoelectric Polarization Charges in N- and Ga-face AlGaN/GaN Heterostructures," *Journal of Applied Physics*. vol. 85, No. 6, pp. 3222-3233 (Mar. 1999).

Beaumont, B. et al., "Epitaxial Lateral Overgrowth of GaN," *Phys. Stat. Sol.* (b) 227, No. 1, pp. 1-43 (2001).

\* cited by examiner

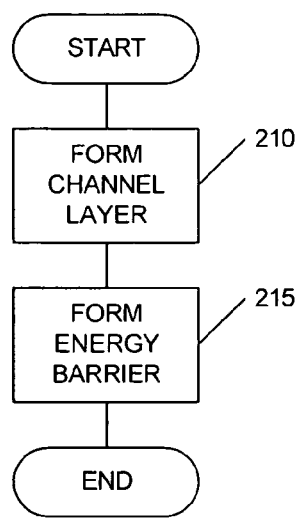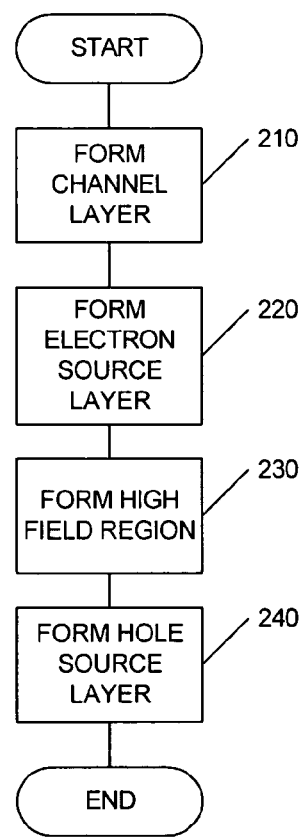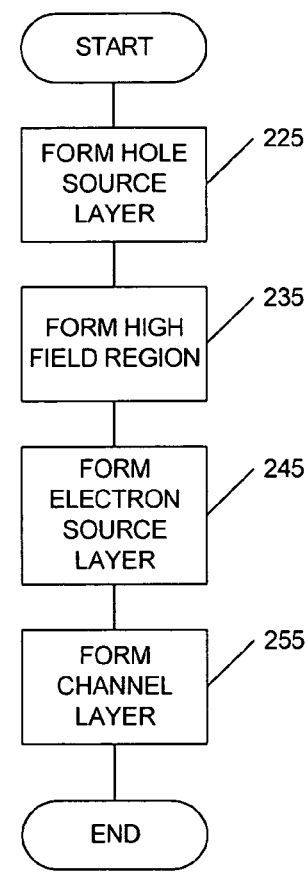
FIG. 16
FIG. 17
FIG. 18

NITRIDE HETEROJUNCTION TRANSISTORS HAVING CHARGE-TRANSFER INDUCED ENERGY BARRIERS AND METHODS OF FABRICATING THE SAME

BACKGROUND OF THE INVENTION

1. Field of the Invention

The present invention relates to high frequency transistors and in particular relates to microwave field effect transistors (FETs) that incorporate nitride-based active layers.

2. Description of the Related Art

The present invention relates to transistors formed of nitride semiconductor materials that can make them suitable for high power, high temperature, and/or high frequency applications. Materials such as silicon (Si) and gallium arsenide (GaAs) have found wide application in semiconductor devices for lower power and (in the case of Si) lower frequency applications. These more common semiconductor materials may not be well suited for higher power and/or high frequency applications, however, because of their relatively small bandgaps (e.g., 1.12 eV for Si and 1.42 for GaAs at room temperature) and/or relatively small breakdown voltages.

GaAs based HEMTs have become the standard for signal amplification in civil and military radar, handset cellular, and satellite communications. GaAs has a higher electron mobility (approximately 6000 cm$^2$/V-s) and a lower source resistance than Si, which may allow GaAs based devices to function at higher frequencies. However, GaAs has a relatively small bandgap (1.42 eV at room temperature) and relatively small breakdown voltage, which may prevent GaAs based HEMTs from providing high power at high frequencies.

In light of the difficulties presented by Si and GaAs, interest in high power, high temperature and/or high frequency applications and devices has turned to wide bandgap semiconductor materials such as silicon carbide (2.996 eV for alpha SiC at room temperature) and the Group III nitrides (e.g., 3.36 eV for GaN at room temperature). These materials typically have higher electric field breakdown strengths and higher electron saturation velocities as compared to gallium arsenide and silicon.

A device of particular interest for high power and/or high frequency applications is the high electron mobility transistor (HEMT), which is also known as a modulation doped field effect transistor (MODFET) or a Heterostructure Field Effect Transistor (HFET). These devices may offer operational advantages under a number of circumstances. They are typically characterized by the presence of a two-dimensional electron gas (2DEG) formed at the heterojunction of two semiconductor materials with different bandgap energies, where the smaller bandgap material has a higher electron affinity compared to the larger bandgap material. The 2DEG, which forms due to the presence of an accumulation layer in the smaller bandgap material, can contain a very high sheet electron concentration in excess of, for example, 10$^{13}$ carriers/cm$^2$ even though the material is nominally undoped. Additionally, electrons that originate in the wider-bandgap semiconductor transfer to the 2DEG, allowing a high electron mobility due to reduced ionized impurity scattering.

This combination of high carrier concentration and high carrier mobility can give the HEMT a very large transconductance and may provide a performance advantage over metal-semiconductor field effect transistors (MESFETs) for high-frequency applications, although MESFETs continue to be suitable for certain applications based on factors such as cost and reliability.

High electron mobility transistors fabricated in the gallium nitride (GaN) material system have the potential to generate large amounts of RF power because of the combination of material characteristics that includes the aforementioned high breakdown fields, their wide bandgaps, large conduction band offset, and/or high saturated electron drift velocity. In addition, polarization of GaN-based materials contributes to the accumulation of carriers in the 2DEG region.

GaN-based HEMTs have already been demonstrated. U.S. Pat. No. 6,316,793, to Sheppard et al., which is commonly assigned and is incorporated herein by reference, describes a HEMT device having a semi-insulating silicon carbide substrate, an aluminum nitride buffer layer on the substrate, an insulating gallium nitride layer on the buffer layer, an aluminum gallium nitride barrier layer on the gallium nitride layer, and a passivation layer on the aluminum gallium nitride active structure.

Improvements in the manufacturing of GaN semiconductor materials have focused interest on the development of GaN HEMTs for high frequency, high temperature and high power applications. GaN-based materials have large bandgaps, and high peak and saturation electron velocity values [B. Belmont, K. Kim and M. Shur, J. Appl. Phys. 74, 1818 (1993)]. GaN HEMTs can also have 2DEG sheet densities in excess of 10$^{13}$/cm$^2$ and relatively high electron mobility (up to 2000 cm$^2$/V-s) [R. Gaska, J. W. Yang, A. Osinsky, Q. Chen, M. A. Khan, A. O. Orlov, G. L. Snider and M. S. Shur, Appl. Phys. Lett., 72, 707 (1998)]. These characteristics may allow GaN HEMTs to provide high power at higher frequencies.

A conventional GaN HEMT structure 110 is illustrated in FIG. 14. A channel layer 114 is formed on buffer layer 113 on a substrate 112. A barrier layer 116 is formed on the channel layer 114. A source electrode 118 and a drain electrode 120 form ohmic contacts through the surface of the barrier layer 116 to the electron layer that is present at the top of the channel layer 114. A gate electrode 122 forms a non-ohmic contact to the surface of the barrier layer 116.

Typically, the channel layer 114 includes GaN while barrier layer 116 includes AlGaN. Because of the presence of aluminum in the crystal lattice, AlGaN has a wider bandgap than GaN. Thus, the interface between a GaN channel layer 114 and an AlGaN barrier layer 116 forms a heterostructure or heterojunction where energy bands are deformed due to, for example, Fermi level alignment and polarization in the material.

FIG. 15 is an exemplary band diagram showing the energy levels in the device along a portion of section I–I' of FIG. 14. As illustrated in FIG. 14, because the barrier layer 116 has a lower electron affinity (X) than the channel layer 114, when the Fermi levels in the materials align due to charge transfer, the energy bands of the channel layer 114 are shifted upwards, while those of the barrier layer are shifted downwards. As shown in FIG. 15, using properly designed materials, the conduction band $E_c$ dips below the Fermi level (Ef) in the area of the channel layer 114 that is immediately adjacent to barrier layer 116, forming a narrow accumulation region. Consequently, a two dimensional electron gas (2DEG) sheet charge region 115 is induced in the accumulation region at the heterojunction between the channel layer 114 and the barrier layer 116. The barrier layer 116 is made sufficiently thin so as to be depleted of mobile carriers by the junction formed with the gate 122 and the resulting shape of the conduction band.

In addition, in a nitride-based device, the conduction and valence bands in the barrier layer 116 are further distorted due to polarization effects. This very important property of the heterostructures in the III-Nitride system may be essential for the high performance of the GaN HEMT. In addition to the accumulation of electrons due to the bandgap differential and band offset between the barrier and channel layers, the total number of free electrons is enhanced greatly by pseudomorphic strain in the barrier layer relative to the channel. Due to localized piezoelectric effects, the strain causes an enhanced electric field and a higher electron concentration than would, typically, be possible were the strain not present.

Electrons in the 2DEG sheet charge region 115 demonstrate high carrier mobility. Moreover, because the sheet charge region is extremely thin, the carriers are subject to reduced impurity scattering that may improve the device's noise characteristics.

The source to drain conductivity of this device structure is modulated by applying a voltage to the gate electrode 122. When a reverse voltage is applied, the conduction band beneath the gate is elevated, with the result that the conduction band $E_c$ in the vicinity of the sheet charge region 115 becomes elevated above the Fermi level, and a portion of the sheet charge region 115 is depleted of carriers, thereby preventing or reducing the flow of current from source 118 to drain 120.

By forming the barrier layer 116 from AlN, certain advantages can be achieved. The 2.4% lattice mismatch between AlN(Al$_y$Ga$_{1-y}$N for y=1) and GaN results in an increased and even maximum possible piezoelectric charge at the interface between the two layers. Using an AlN barrier layer also reduces the piezoelectric scattering between the layers that can limit the 2DEG mobility.

However, the high lattice mismatch between AlN and GaN dictates that the thickness of the AlN layer should be less than 50 Å. If the layer is thicker, the device can experience problems with its ohmic contacts, the material quality in the layer begins to degrade, the device's reliability decreases, and the material is more difficult to grow. However, a HEMT with a 50 Å or less AlN layer may be susceptible to high gate leakage.

Although GaN-based HEMTs have demonstrated exceptional power densities, a number of technical challenges still remain to be overcome before the devices can achieve commercial success. For example, one problem that may limit the performance and lifetime of certain GaN-based HEMTs is free carrier trapping, which may occur when carriers migrate away from the 2DEG region and become trapped in a surface dielectric region or in a buffer region beneath the channel. Such trapping may result in degradation in performance and/or reliability of a device.

Some attempts have been made to improve confinement of carriers within a HEMT channel by providing a second heterojunction below the channel—a so-called Double Heterostructure HEMT or DH-HEMT. However, in general, the amount of confinement due to the heterobarrier (which is a function of the difference in electron affinity between a wide-bandgap layer and the narrower-bandgap channel) may not be sufficiently large to result in effective confinement. Moreover, in a highly polarized material such as c-plane GaN, the polarization charges present in the material may reduce the confinement effect of the heterobarrier. Thus, in nitride-based transistor devices, the mere presence of a heterojunction alone below the channel may not be sufficient to effectively prevent carriers from migrating away from the 2DEG region into the buffer region where they can become trapped. Moreover, the structure of a DH-HEMT provides no additional barrier against surface trapping effects.

Another problem associated with the transit of carriers away from the channel region is linearity. When carriers are not confined to the channel, the ability to control their action via the applied gate voltage may be reduced, resulting in undesirable nonlinear transconductance characteristics.

The problems associated with free carrier trapping may also affect the performance of other types of nitride field effect transistors, such as GaN-based MESFETs.

SUMMARY OF THE INVENTION

Embodiments of the present invention provide nitride-based field effect transistors having a substrate, a channel layer that includes InAlGaN formed on the substrate; source and drain ohmic contacts in electrical communication with the channel layer; and a gate contact formed on the channel layer. At least one energy barrier is formed between the channel layer and the substrate or between the channel layer and a surface of the device opposite the substrate. The energy barrier may include an electron source layer in proximity with a hole source layer. The energy barrier has an associated electric field directed away from the channel layer. The energy barrier may arise due to charge transfer between the electron source layer and the hole source layer and may have a peak electric field in excess of about $2 \times 10^5$ V/cm.

Particular embodiments of the invention provide a HEMT capable of high-frequency operation that includes a substrate; a channel layer that includes InAlGaN formed on the substrate, a barrier layer that includes InAlGaN formed on the channel layer, the barrier layer having a bandgap greater than a bandgap of the channel layer. The barrier layer and the channel layer cooperatively induce a two-dimensional electron gas at an interface between the channel layer and the barrier layer. At least one energy barrier is formed adjacent the barrier layer and/or the channel layer, the energy barrier includes an electron source layer in proximity with a hole source layer.

In certain embodiments, the electron source layer includes a layer doped with n-type dopants. In other embodiments, the electron source layer includes a heterointerface between a first InAlGaN layer and a second InAlGaN layer.

In certain embodiments the electron source layer includes a heterointerface between the channel layer and the barrier layer.

The hole source layer may include a layer doped with p-type dopants. In certain embodiments, the hole source layer includes a layer co-doped with deep-level transition elements and shallow acceptor dopants, or doped with deep level acceptor dopants. Alternatively, the hole source layer may include a heterointerface between a first InAlGaN layer and a second InAlGaN layer.

The electron source layer and the hole source layer may or may not be fully depleted under equilibrium conditions.

An energy barrier according to embodiments of the present invention may provide a built-in potential barrier in excess of about 0.5V. In particular embodiments, the energy barrier may provide a built-in potential barrier in excess of about 1V. In further embodiments, the energy barrier may provide a built-in potential barrier in excess of about 2V.

Embodiments of the present invention also include forming a channel region and forming an energy barrier that opposes the movement of carriers away from the channel region. Some embodiments of the invention include forming a channel region and forming an energy barrier that opposes the movement of carriers away from the channel region on each side of the channel region.

In some embodiments, forming an energy barrier includes forming an electron source layer, a hole source layer, and a high field region between the electron source layer and the hole source layer. In some embodiments, the channel layer may be formed on the electron source layer. In other embodiments, the electron source layer may be formed after formation of the channel layer.

In particular embodiments, a hole source layer is formed, a high field region is formed on the hole source layer, and an electron source layer is formed on the high field region. A channel layer is formed on the electron source layer. For HEMT structures, a barrier layer may be formed on the channel layer in order to facilitate generation of a 2DEG region between the channel layer and the barrier layer.

In other embodiments, a channel layer is formed, an electron source layer is formed on the channel layer, a high field region is formed on the electron source layer and a hole source layer is formed on the high field region.

In still further embodiments of the present invention, the built-in potential is generated by a quantum well adjacent the channel layer. The quantum well may be provided by a first nitride layer adjacent the channel layer and a second Group III-nitride based layer adjacent the first nitride layer and opposite the channel layer. The first nitride layer has a band gap that is narrower than a band gap of the channel layer and a lattice constant that is larger than a lattice constant of the channel layer, and the second Group III-nitride based layer has a band gap and a lattice constant that are substantially the same as the band gap and lattice constant of the channel layer.

In certain embodiments of the present invention, the first nitride layer is InN and the channel layer and second Group III-nitride based layer are GaN. The first nitride layer may have a thickness of about one or two monolayers. The channel layer may have a thickness of from about 30 Å to about 300 Å.

DESCRIPTION OF THE DRAWINGS

FIGS. 16–18 are flowcharts illustrating operations according to further embodiments of the invention.

DETAILED DESCRIPTION

Figure 1:
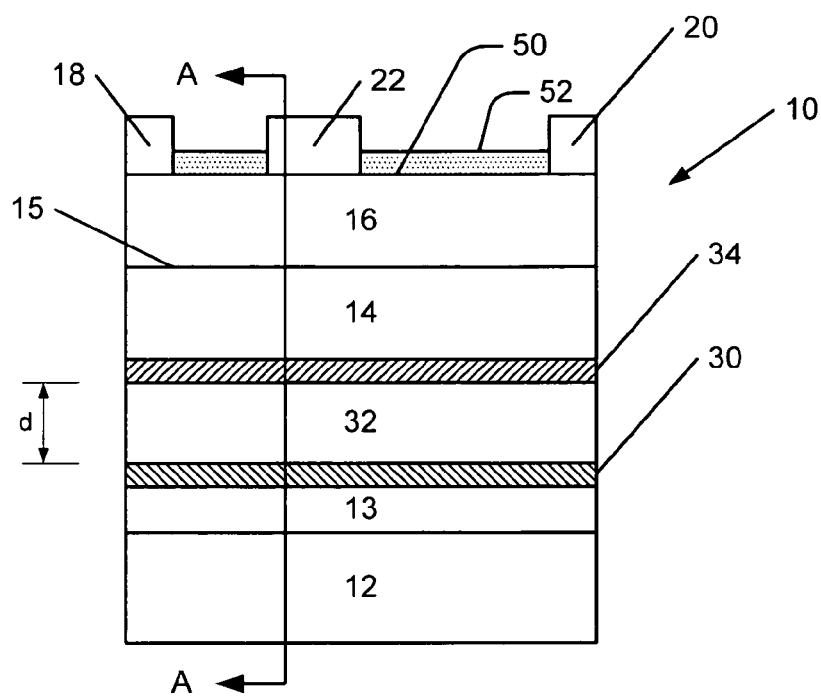
FIG. 1 is a schematic drawing showing a transistor structure according to embodiments of the present invention.

The present invention will now be described more fully with reference to the accompanying drawings in which some embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Furthermore, the various layers and regions illustrated in the figures are illustrated schematically. Accordingly, the present invention is not limited to the relative size and spacing illustrated in the accompanying figures. As will also be appreciated by those of skill in the art, references herein to a layer formed "on" a substrate or other layer may refer to the layer formed directly on the substrate or other layer or on an intervening layer or layers formed on the substrate or other layer. As used herein the term "and/or" includes any and all combinations of one or more of the associated listed items.

It will be understood that although the terms first, second, etc. may be used herein to describe various regions, layers, and/or sections, these regions, layers, and/or sections should not be limited by these terms. These terms are only used to distinguish one region, layer, or section from another region, layer, or section. Thus, a first region, layer, or section discussed below could be termed a second region, layer, or section, and similarly, a second without departing from the teachings of the present invention.

As discussed above, confinement of carriers in the channel is an important concern in the design of a nitride-based field effect transistor. Embodiments of the present invention may provide enhanced confinement of carriers through the inclusion of a high-field region on one or both sides of a channel. The electric field in the high field region may be generated by the transfer of charge between an electron source region and a hole source region. The electric field in the high field region is directed away from the channel. Thus, the electric field opposes the movement of negatively charged electrons away from the channel. (In general, the direction of an electric field is defined by the direction of electric force acting on a positively charged particle.)

As used herein, the term "Group III nitride" refers to those semiconducting compounds formed between nitrogen and the elements in Group III of the periodic table, usually aluminum (Al), gallium (Ga), and/or indium (In). The term also refers to ternary and quaternary compounds such as AlGaN and AlInGaN. As is well understood by those in this art, the Group III elements can combine with nitrogen to form binary (e.g., GaN), ternary (e.g., AlGaN, AlInN), and quaternary (e.g., AlInGaN) compounds. These compounds all have empirical formulas in which one mole of nitrogen is combined with a total of one mole of the Group III elements. Accordingly, formulas such as $Al_xGa_{1-x}N$ where $0 \leq x \leq 1$ are often used to describe them. For brevity, when the term AlInGaN is used herein without specification of relative percentages for the Group III elements (Al, In and Ga), it will be understood to refer to a compound of the general formula $In_xAl_yGa_zN$ where $x+y+z=1$, $0 \leq x \leq 1$, $0 \leq y \leq 1$, and $0 \leq z \leq 1$. Thus, as used herein, the term InAlGaN may refer to GaN, InN, AlN, AlGaN, AlInN, InGaN and/or AlInGaN unless otherwise specified or limited. Accordingly, the terms "InAlGaN", "Group III-nitride material" and "nitride-based material" are used interchangeably throughout this specification.

Embodiments of the present invention are schematically illustrated as a high electron mobility transistor (HEMT) 10 in the cross-sectional view of FIG. 1. The transistor 10 includes a substrate 12 that may be, for example, semi-insulating silicon carbide (SiC) of the 4H polytype. Other silicon carbide candidate polytypes including the 2H, 3C, 6H, and 15R polytypes may be utilized. The term "semi-insulating" is used descriptively in a relative sense rather than in an absolute sense. In particular embodiments of the present invention, the silicon carbide bulk crystal may have a resistivity equal to or higher than about $1 \times 10^5$ Ω-cm at room temperature.

A buffer layer 13 on the substrate 12 provides an appropriate crystalline transition between the substrate 12 and the remainder of the device. Buffer layer 13 may include one or more layers of InAlGaN. In particular embodiments, buffer layer 13 may include AlN or AlGaN. Silicon carbide has a much closer crystal lattice match to Group III nitrides than does sapphire ($Al_2O_3$), which is a very common substrate material for Group III nitride devices. The closer lattice match may result in Group III nitride films of higher quality than those generally available on sapphire. Silicon carbide also has a very high thermal conductivity so that the total output power of Group III nitride devices on silicon carbide is, typically, not as limited by thermal dissipation of the substrate as in the case of the same devices formed on sapphire. Also, the availability of semi-insulating silicon carbide substrates may provide for device isolation and reduced parasitic capacitance.

Although silicon carbide is the preferred substrate material, embodiments of the present invention may utilize any suitable substrate, such as sapphire, aluminum nitride, aluminum gallium nitride, gallium nitride, silicon, GaAs, LGO, ZnO, LAO, InP and the like. In some embodiments, an appropriate buffer layer also may be formed.

Suitable SiC substrates are manufactured by, for example, Cree, Inc., of Durham, N.C., the assignee of the present invention, and the methods for producing are described, for example, U.S. Pat. Nos. Re. 34,861; 4,946,547; 5,200,022; and 6,218,680, the contents of which are incorporated herein by reference in their entirety. Similarly, techniques for epitaxial growth of Group III nitrides have been described in, for example, U.S. Pat. Nos. 5,210,051; 5,393,993; 5,523,589; and 5,592,501, the contents of which are also incorporated herein by reference in their entirety.

Particular structures for GaN-based HEMTs are described, for example, in commonly assigned U.S. Pat. No. 6,316,793 and U.S. application Ser. No. 09/904,333 filed Jul. 12, 2001 for "ALUMINUM GALLIUM NITRIDE/GALLIUM NITRIDE HIGH ELECTRON MOBILITY TRANSISTORS HAVING A GATE CONTACT ON A GALLIUM NITRIDE BASED CAP SEGMENT AND METHODS OF FABRICATING SAME," U.S. provisional application Ser. No. 60/290,195 filed May 11, 2001 for "GROUP III NITRIDE BASED HIGH ELECTRON MOBILITY TRANSISTOR (HEMT) WITH BARRIER/SPACER LAYER," U.S. patent application Ser. No. 10/102,272, to Smorchkova et al., entitled "GROUP-III NITRIDE BASED HIGH ELECTRON MOBILITY TRANSISTOR (HEMT) WITH BARRIER/SPACER LAYER" and U.S. patent application Ser. No. 10/199,786, to Saxler, entitled "STRAIN BALANCED NITRIDE HETEROJUNCTION TRANSISTORS AND METHODS OF FABRICATING STRAIN BALANCED NITRIDE HETEROJUNCTION TRANSISTORS" the disclosures of which are hereby incorporated herein by reference in their entirety. Embodiments of the present invention may be incorporated into such structures and, therefore, should not be construed as limited to the particular structures described in detail herein.

Returning again to FIG. 1, a transistor 10 includes a channel layer 14. In some embodiments of the present invention, the channel layer 14 includes InAlGaN. In particular embodiments, the channel layer 14 includes $Al_xGa_{1-x}N$ ($0 \leq x \leq 1$). In some embodiments of the present invention, the channel layer 14 includes GaN. The channel layer 14 may be undoped and may be grown to a thickness of between about 50 and about 500 Å. Thus, the channel layer 14 may be thinner than channel layers in conventional GaN HEMT devices, which are typically greater than 500 Å in thickness. In some of the embodiments described above, it may be desirable for the semiconductor crystal structure to be oriented in a Ga-polar (or Group III polar) orientation to enhance the effect of the piezoelectric quality of the material. However, many of the embodiments, including the embodiment of FIG. 1, may be formed using N-polar or non-polar material without departing from the scope of the invention.

A barrier layer 16 is provided on the channel layer 14. The barrier layer 16 may be a Group III-nitride having a bandgap larger than that of the channel layer 14. Accordingly, the barrier layer 16 may be AlGaN, AlInGaN, AlInN and/or AlN. The barrier layer 16 may be at least about 10 nm thick, but is not so thick as to cause cracking or defect formation therein. Moreover, the barrier layer 16 should be thin enough that it is completely depleted under equilibrium conditions.

Preferably, the barrier layer 16 is undoped or doped with activated donor atoms at a concentration of less than about $10^{19}$ cm$^{-3}$. In some embodiments, the barrier layer 16 may be delta-doped at a concentration of up to about $10^{13}$ cm$^{-2}$ at a distance of about 100 Å from the interface between barrier layer 16 and channel layer 14. In some embodiments of the invention, the barrier layer 16 includes $Al_xGa_{1-x}N$ where $0<x \leq 1$. In certain embodiments of the present invention, the barrier layer 16 includes AlGaN with an aluminum concentration of between about 5% and about 100%. In specific embodiments of the present invention, the aluminum concentration is greater than about 10%. The barrier layer 16 has a bandgap greater than that of the channel layer 14.

The barrier layer may also be provided with multiple layers as described in U.S. patent application Ser. No. 10/102,272, to Smorchkova et al., entitled "GROUP-III NITRIDE BASED HIGH ELECTRON MOBILITY TRANSISTOR (HEMT) WITH BARRIER/SPACER LAYER" and U.S. Pat. No. 6,316,793 entitled "Nitride Based Transistors on Semi-Insulating Silicon Carbide Substrates with Passivation Layer" issued Nov. 13, 2001, the disclosures of which are incorporated herein by reference as if set forth fully herein. Thus, embodiments of the present invention should not be construed as limiting the barrier layer to a single layer but may include, for example, barrier layers having combinations of InAlGaN layers having various material compositions. For example, a GaN/AlN structure may be utilized to reduce or prevent alloy scattering.

An optional InAlGaN contact layer or cap layer (not shown) may be provided on the barrier layer 16 to facilitate the formation of contacts of the transistor 10. An example of such a cap layer is disclosed in U.S. application Ser. No. 09/904,333 filed Jul. 12, 2001 for "ALUMINUM GALLIUM NITRIDE/GALLIUM NITRIDE HIGH ELECTRON MOBILITY TRANSISTORS HAVING A GATE CONTACT ON A GALLIUM NITRIDE BASED CAP SEGMENT AND METHODS OF FABRICATING SAME," which is referenced above. In addition, there may be a compositionally graded transition layer (not shown) between the barrier layer 16 and the contact or cap layer. The source contact 18, the drain contact 20 and the gate contact 22 may be fabricated as described in U.S. Pat. No. 6,316,793.

As discussed above, a 2DEG sheet charge region 15 is induced at the interface between channel layer 14 and barrier layer 16. In order to reduce the movement of carriers away from the channel layer 14, a region 32 having a high electric field is provided between the channel layer 14 and the buffer layer 13. In some embodiments, the high field is generated by charge transfer between an electron source layer 34 and a hole source layer 30 which are spaced apart by a distance "d" which defines the thickness of the high field region 32.

In some embodiments, including the embodiment illustrated in FIG. 1, the electron source layer 34 may include a thin layer of a Group III-nitride material such as $Al_xGa_{1-x}N$ ($0 \leq x \leq 1$) that is highly doped with donor (n-type) dopants, while the hole source layer 30 may include a thin layer of a Group III-nitride material such as $Al_xGa_{1-x}N$ ($0 \leq x \leq 1$) that is highly doped with acceptor (p-type) dopants. The electron source layer 34 and the hole source layer 30 are spaced apart by a distance "d" that defines a high field region 32 therebetween. When the electron source layer 34 and the hole source layer 30 are formed, charge transfer between the layers occurs to cause the Fermi levels of the layers to align (i.e. to ensure that under equilibrium conditions, the average electron energy is the same throughout the structure). This charge transfer causes a depletion region to form between the electron source region and the hole source region. The charge transfer may fully deplete the electron source region and/or the hole source region. The depletion region is characterized by a high electric field directed away from the channel layer 14. The magnitude of the induced electric field is proportional to the doping levels in the electron source layer and the hole source layer. A built-in potential is developed between the electron source layer and the hole source layer that is proportional to the thickness of the high field region (i.e. the distance between the electron source region and the hole source region. Accordingly, by selecting appropriate values for the thickness, doping level and spacing of the electron source layer 34 and the hole source layer 30, a potential barrier up to the bandgap (less the donor and acceptor ionization energies) may be formed. However, it may be preferable to provide a potential barrier somewhat less than the theoretical maximum, for example less than about 3 eV for GaN (which has a nominal bandgap of about 3.5 eV).

Moreover, the buffer 13 may be doped with deep acceptors as described in S. Heikman et al., Growth of Fe-Doped Semi-insulating GaN by Metalorganic Chemical Vapor Deposition, Appl. Phys. Let. 81, pp. 439–441 (2002). Specific examples of co-doped layers are provided in U.S. patent application Ser. No. 10/752,290, entitled "Co-Doping for Fermi Level Control in Semi-Insulating Group III Nitrides," filed Jan. 7, 2004, and assigned to the assignee of the present invention, the disclosure of which is incorporated herein by reference. The buffer could be doped with Fe or another deep acceptor.

Figure 2:
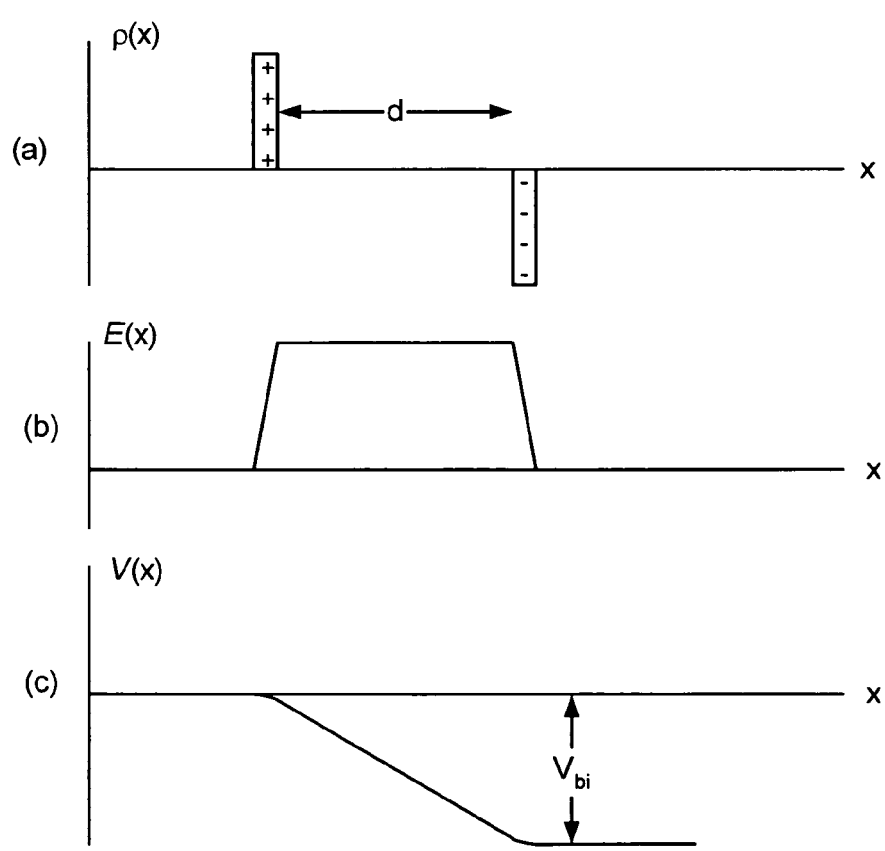
FIG. 2 is an illustrative graph showing (a) the charge density, (b) electric field and (c) electric potential within a region of the structure of FIG. 1.

This effect is illustrated in FIG. 2, which shows illustrative graphs of charge (FIG. 2(a)), electric field (FIG. 2(b)) and voltage (FIG. 2(c)) in the vicinity of a pair of thin, oppositely doped layers having high dopant concentrations. Graphs of band energies, voltages, electric fields and charge such as the graphs in FIG. 2 are not intended to be to scale, nor are they graphs of actual measurements. Rather, they are exemplary graphs that are included merely to illustrate various characteristics of the structures in question.

Because the electron source layer is designed to be fully depleted, the layer is characterized by a fixed positive charge from the ionized donor atoms. In the illustration of FIG. 2, the electron source layer and hole source layer are modeled as thin, highly doped layers spaced a distance "d" apart. The electric field within the structure is obtained by integrating the charge density along the direction of interest. Mathematically, the electric field E is given by the following equation:

$$E(x) = \frac{1}{K_s \varepsilon_0} \int_{\infty}^{x} \rho(x) dx$$

where $K_s$ is the relative dielectric constant of the semiconductor material and $\varepsilon_0$ is the permittivity of free space. Since the structure is in equilibrium, the net charge density is assumed to be zero within the immediate vicinity of the electron source layer and hole source layer but nonzero within those layers. The resulting electric field is shown in FIG. 4(b). Namely, the field is approximately constant between the electron source layer and the hole source layer, and zero elsewhere. The electric potential V in the structure is given by the equation:

$$V(x) = -\int_{\infty}^{x} E(x) dx$$

The electric potential in the structure is illustrated in FIG. 2(c). As illustrated therein, the maximum value of the electric potential, called the built-in voltage and designated $V_{bi}$, is reached at the edge of the hole source layer 30. Accordingly, the distance "d" between the electron source layer and the hole source layer and the magnitude of the electric field E collectively determine the magnitude of the potential barrier provided by the high field region 32.

As an example of a design methodology, consider a pair of two oppositely doped layers which are very thin compared to their separation. Assume both are have an identical sheet charge that is depleted. Thus, the sheet charge density in each layer is given as $N_{sheet} = P_{sheet}$ (both given in units of $cm^{-2}$).

The electric field between the two sheets of charge is then $(q \times P_{sheet})/\varepsilon$ where q is the elementary charge ($1.602 \times 10^{-19}$C) and $\varepsilon$ is the dielectric constant of the material (about $9*8.85*10^{-14}$ F/cm for GaN). For GaN, the electric field would be about $P_{sheet}*(2\times10^{-7}$ V-cm). Thus, for a sheet charge density of $10^{12}$ cm$^{-2}$, the field would be about $2\times10^5$ V/cm.

The built in voltage is the product of the electric field with the separation distance d.

$$V_{bi}=d*(q*P_{sheet})/\in$$

This voltage is necessarily less than $E_g$–$E_a$–$E_d$ where $E_g$ is the energy gap, $E_a$ is the acceptor ionization energy relative to the valence band and Ed is the donor ionization energy relative to the conduction band. To ensure full depletion, a voltage for the barrier should be chosen to be safely below $E_g$–$E_a$–$E_d$.

So, if $V_{bi}<(E_g-E_a-E_d)/q$

Then $d\times(q\times P_{sheet})/\in<(E_g-E_a-E_d)/q$ $d\times P_{sheet}\times(2\times10^{-7}$ V-cm$)<(E_g-E_a-E_d)/q$ $d\times P_{sheet}<5\times10^6\times(E_g-E_a-E_d)/q(V^{-1}$ cm$^{-1}$)

If we assume relatively shallow acceptors and donors, a 2V barrier may be an appropriate goal.

$d\times P_{sheet}<2\times5\times10^6/\text{cm}=10^7/\text{cm}$ $d\times P_{sheet}<10^7/\text{cm}\times10^4$ µm/cm $d\times P_{sheet}<10^{11}$ µm/cm$^2$ If we choose a sheet charge density that is small compared to the channel charge, but large enough for a field that may improve confinement, for example $10^{12}$ cm$^{-2}$ then $d<10^{11}$ µm/cm$^2/P_{sheet}$ or d<0.1 µm In order to obtain a sheet density of $10^{12}$ cm$^{-2}$ in the electron source layer 34 and the hole source layer 30, the semiconductor crystal may be delta doped. As is known in the art, delta doping refers to doping a semiconductor layer with a very high density of dopants in a very thin region. For example, to form hole source layer 30, the semiconductor crystal of $Al_xGa_{1-x}N$ may be doped with an acceptor such as Mg or Zn at an activated concentration of about $10^{18}$ cm$^{-3}$ for a depth of about 10 nm. Hole source layer 30 may be doped with deep level acceptor elements such as Fe or V. Alternatively, hole source layer 30 may be co-doped with deep level transition elements, such as Fe or V, along with shallow acceptor dopants, such as Zn and/or Mg. Using shallow acceptors with smaller activation energies $E_a$ may yield a larger maximum built-in voltage $V_{bi}$. However, if the material is overdoped, free acceptors could be generated which would adversely impact device performance. Also, it is undesirable to form a "camel hump" in the conduction band $E_c$ that could trap electrons. Thus, it may be preferable to keep $V_{bi}$ fairly low and choose a dopant with a low memory effect in the growth system.

Similarly, the electron source layer may be doped with Si, Ge or O atoms. However, other forms of doping may be used in conjunction with thicker layers. For example, doping in the layers could be progressively graded or abrupt. Moreover, the electron source layer and the hole source layer may be thicker or thinner than 10 nm. In general, the electron source layer and hole source layer may each range in thickness from about 0.2 nm to about 100 nm. The electron source layer and the hole source layer do not have to have the same thickness or doping density.

Thus, for a 2V barrier, "d" may be less than about 0.1 µm. In general, depending on the desired barrier height and the doping levels used, the thickness "d" of the high field region 32 may range from about 10 nm to about 200 nm.

Depending on the desired barrier, different doping levels and spacings may be chosen. In some embodiments, the barrier may have a potential height of less than about 0.5V. In other embodiments, the barrier height may be about 1V or less. In still other embodiments, the barrier height may be about 2V or less. As discussed above, the limit on the barrier height is that it be less than $(E_g-E_a-E_d)$.

Figure 1A:
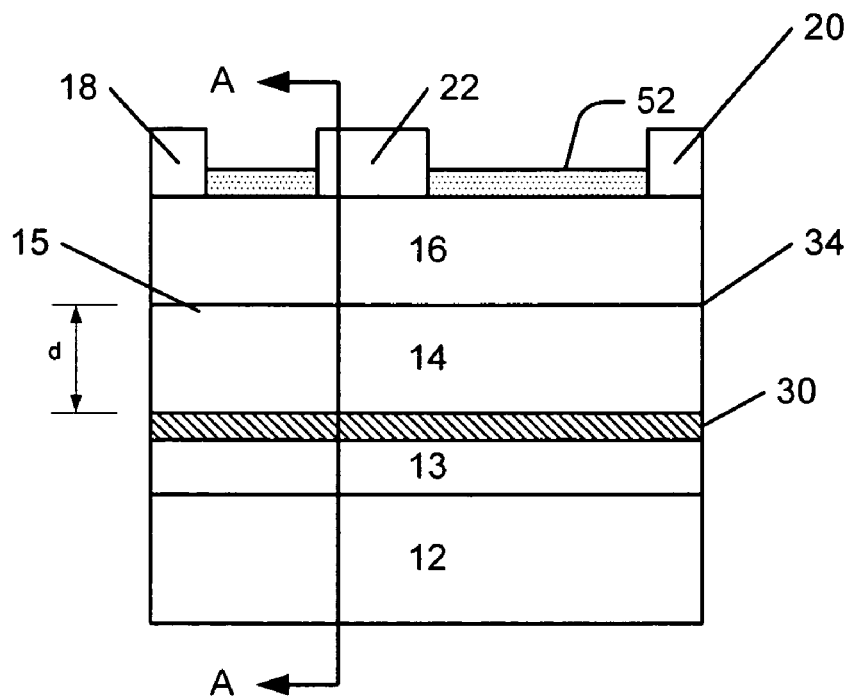
FIG. 1A is a schematic drawing showing a transistor structure according to further embodiments of the present invention.

In some embodiments, the electron source layer may include the 2DEG region induced at the interface of the barrier layer and the channel layer. In such embodiments, the 2DEG region should not be fully depleted by the hole source region. An example of such embodiments is shown in FIG. 1A in which a hole source region 30 is formed beneath the channel layer 14. The 2DEG region 15 at the interface between channel layer 14 and barrier layer 16 acts as the electron source layer 34. Thus, the entire channel layer 14 may function as a high-field region 32 that opposes the movement of carriers away from the 2DEG region 15.

Figure 3:
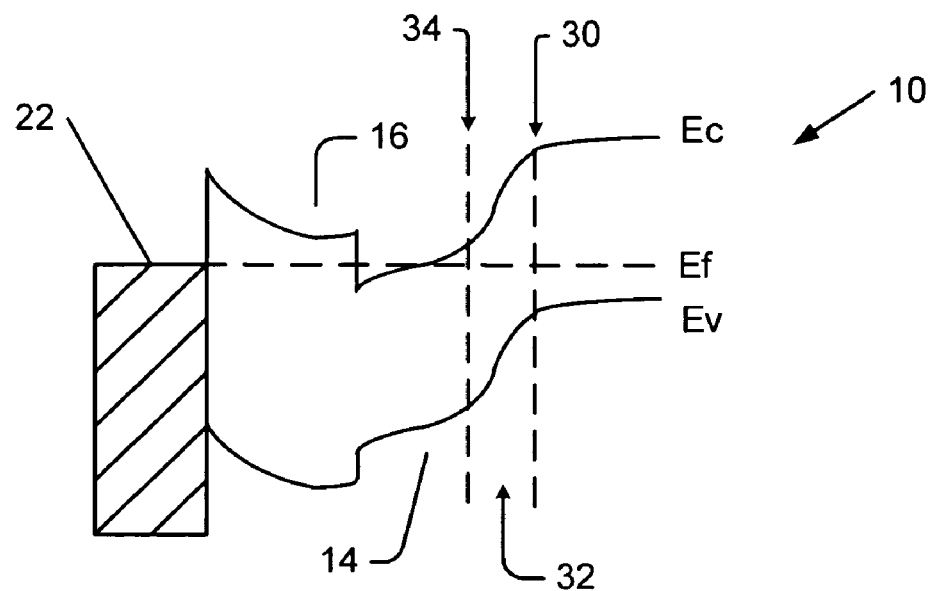
FIG. 3 is an illustrative graph of the band diagram of a region within the embodiments illustrated in FIG. 1.

FIG. 3 is a graph of energy level versus position (x) in portions of the transistor 10. Because of the presence of aluminum in the crystal lattice, AlGaN has a wider bandgap than GaN. Thus, the interface between the channel layer 14 and the barrier layer 16 forms a heterostructure in which the conduction and valence bands $E_c$ and $E_v$ are offset. Charge is induced due to the piezoelectric effect and spontaneous doping. The conduction band $E_c$ dips below the Fermi level $E_f$ in the area of the channel layer 14 that is immediately adjacent to the barrier layer 16. Consequently, a two dimensional electron gas (2DEG) sheet charge region is induced at the heterojunction between the channel layer 14 and the barrier layer 16, while layer 16 is depleted of mobile carriers due to the shape of the conduction band.

The conductivity of this region is modulated by applying a voltage to the gate electrode 22. When a reverse voltage is applied, the conduction band in the vicinity of conduction layer 15 is elevated above the Fermi level, and a portion of the conduction layer 15 is depleted of carriers, thereby preventing the flow of current from the source 18 to the drain 20.

To oppose the movement of electrons away from the channel layer, an energy barrier is formed by inserting the electron source layer 34 and the hole source layer 30 between the channel layer 14 and the buffer layer 13. The electron source layer 34 and the hole source layer 30 are spaced apart by a distance "d" which defines a region 32 having a high electric field. The slope of the energy bands within the region 32 is directly related to the strength of the electric field in this region. As illustrated in FIG. 3, the large slope of the conduction band Ec within the high field region 32 presents a large potential barrier that opposes the movement of electrons from the channel layer 14 toward the buffer layer 13. More specifically, the potential barrier created by the high field region 32 tends to cause electrons in the 2DEG region not to migrate into the buffer region where they could become trapped or become less susceptible to influence by a gate voltage.

Figure 4:
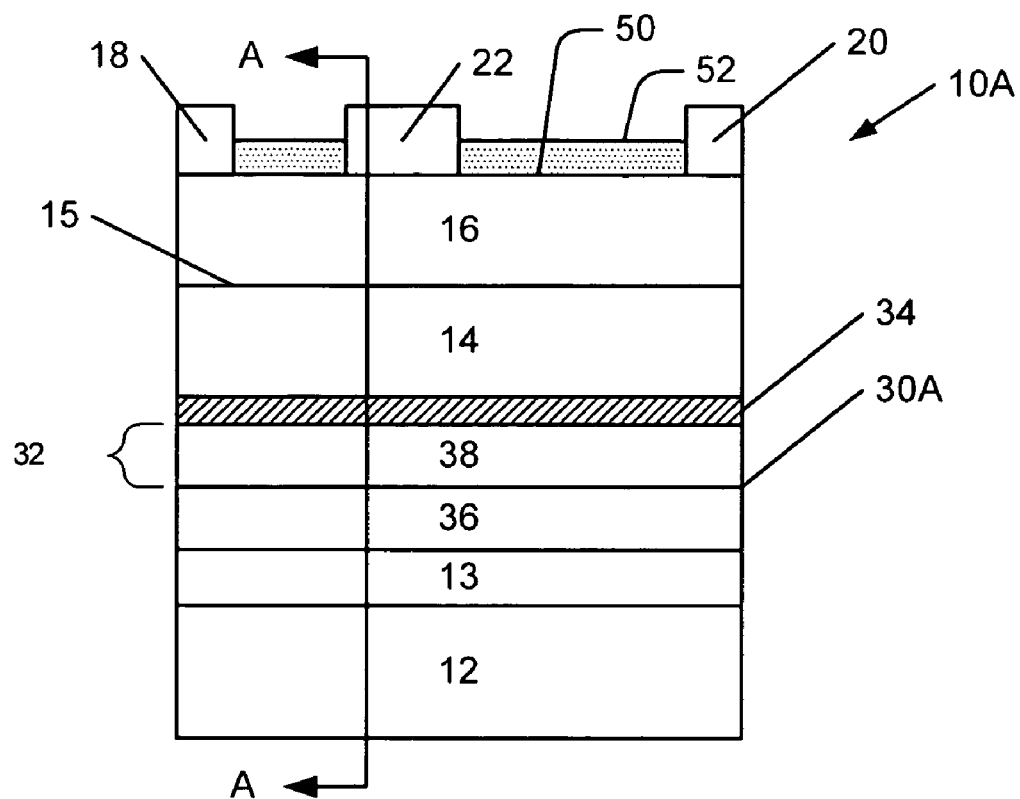
FIG. 4 is a schematic drawing showing a transistor structure according to further embodiments of the present invention.

Other embodiments of the present invention are illustrated in FIG. 4. As described in connection with structure 10 of FIG. 1, structure 10A of FIG. 4 includes a substrate 12, a buffer layer 13, a channel layer 14 and a barrier layer 16 which are formed as described above in connection with FIG. 1. Structure 10A further includes an electron source region 34 and a high electric field region 32. As with the embodiments illustrated in FIG. 1, electron source region 34 that may include a thin, highly doped semiconductor layer. In structure 10A, however, the hole source layer 30 is provided by a heterointerface between a first layer 38 that provides the high field region 32 and a second layer 36. It will be understood that the heterointerface between the first layer 38 and the second layer 36 may include an abrupt or graded junction. The second layer 36, which may include $Al_xGa_{1-x}N$ ($0 \leq x \leq 1$), has a higher bandgap than the first layer 38. The second layer 36 may be undoped, lightly doped with shallow p-type dopants and/or doped with deep-level p-type dopants. Accordingly, when the first and second layers 38 and 36 are formed, the region near the heterointerface between the first and second layers 38 and 36 is induced to become highly p-type due to piezoelectric band bending. Thus, even though the structure does not include a highly p-doped layer, a quasi-p-type region is induced at the interface between the first and second layers 38 and 36 that serves as a hole source region.

As with the embodiments described above, the transfer of carriers between the quasi-p-type region created at the interface between the first and second layers 38 and 36 and the electron source layer 34 creates a high field region 32 that serves as a barrier against electrons transiting away from the 2DEG region 15.

In some embodiments, the second layer 36 comprises InAlGaN. In particular embodiments, the second layer 36 may include $Al_xGa_{1-x}N$ with $0.02 \leq x \leq 0.2$. The second layer 36 may also have a graded composition for lattice matching or strain relief. The second layer 36 may be from 10 nm to 10 μm thick. Moreover, the second layer 36 may be omitted altogether if buffer layer 13 has a suitable aluminum composition such that an interface between buffer layer 13 and the first layer 38 forms a heterojunction capable of acting as a hole source layer.

Figure 5:
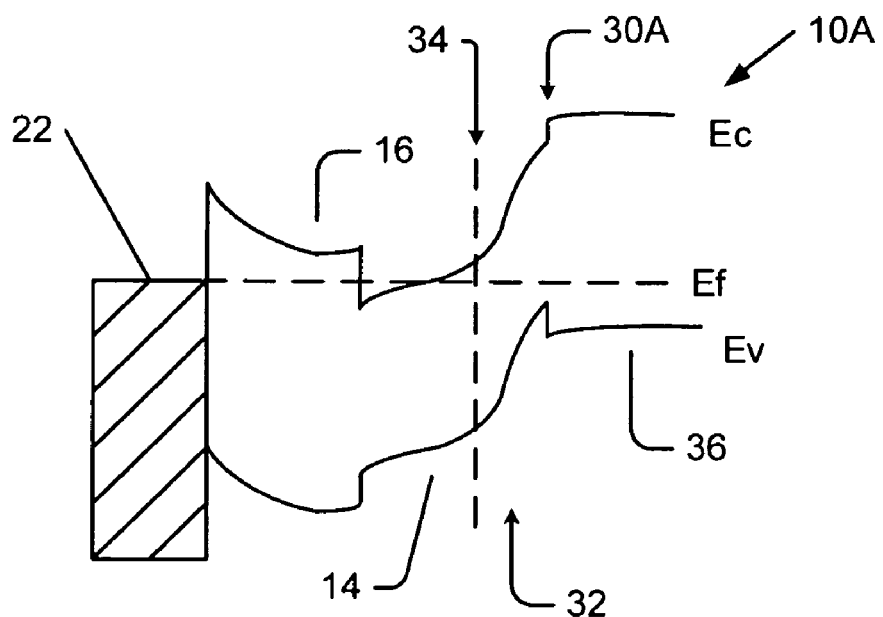
FIG. 5 is an illustrative graph of the band diagram of a region within the embodiments illustrated in FIG. 4.

An illustrative band diagram for the structure of FIG. 4 is shown in FIG. 5. As illustrated in FIG. 5, a high field region 32, characterized by a steep positive slope of the conduction band, is formed between an electron source layer 34 and a hole source layer 30A formed at an interface between high field region 32 and the second layer 36. The electric field within the high field region 32 opposes the movement of carriers away from channel layer 14.

As discussed above, it may also be desirable to prevent as many carriers from the channel layer 14 from reaching the surface of a transistor device. Although the exposed surface of a transistor device is usually passivated, carrier trapping in interface states of a passivation layer may have a negative impact on the performance and/or lifetime of a microwave transistor.

Figure 6:
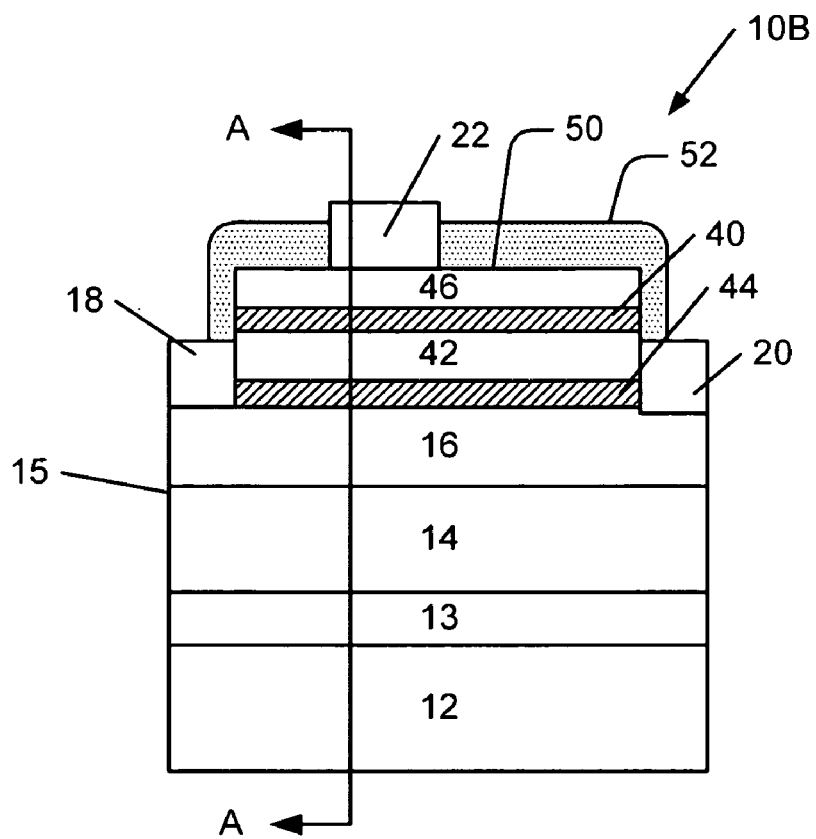
FIG. 6 is a schematic drawing showing a transistor structure according to further embodiments of the present invention.

Accordingly, in some embodiments of the invention, a potential barrier is formed in the structure to resist or oppose the movement of carriers away from the channel layer 14 towards the surface of the device. FIG. 6 illustrates embodiments of the invention in which a potential barrier is formed between the barrier layer 16 and the upper surface 50 of a device 10B by means of a hole source layer 40 and an electron source layer 44 positioned sufficiently close to each other form a high field region 42 there between. As described above in connection with the devices illustrated in FIG. 1 and FIG. 4, device 10B includes a substrate 12, a buffer layer 13, a channel layer 14 and a barrier layer 16. The electron source layer 44 may be formed on the barrier layer 16. The thickness and doping of the electron source layer 44 may be the same as described in connection with reference to the electron source layer 34 of FIG. 1. The hole source layer 40 is formed in close proximity to the electron source layer 44 but spaced apart by a distance "d" that defines high field layer 42. An optional cap layer 46 may be formed on the hole source layer 40. A passivation layer 52 covers the exposed upper surfaces of the device 10B. The passivation layer 52 may include SiN and/or $SiO_2$. The formation of passivation layers on GaN-based layers is well known in the art.

Figure 8:
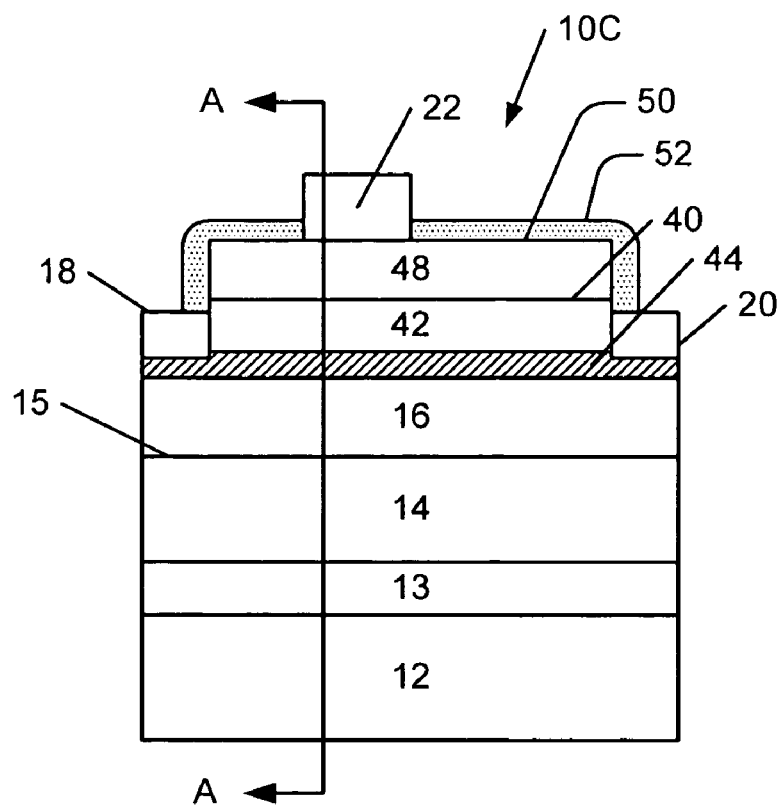
FIG. 8 is a schematic drawing showing a transistor structure according to further embodiments of the present invention.
Figure 10:
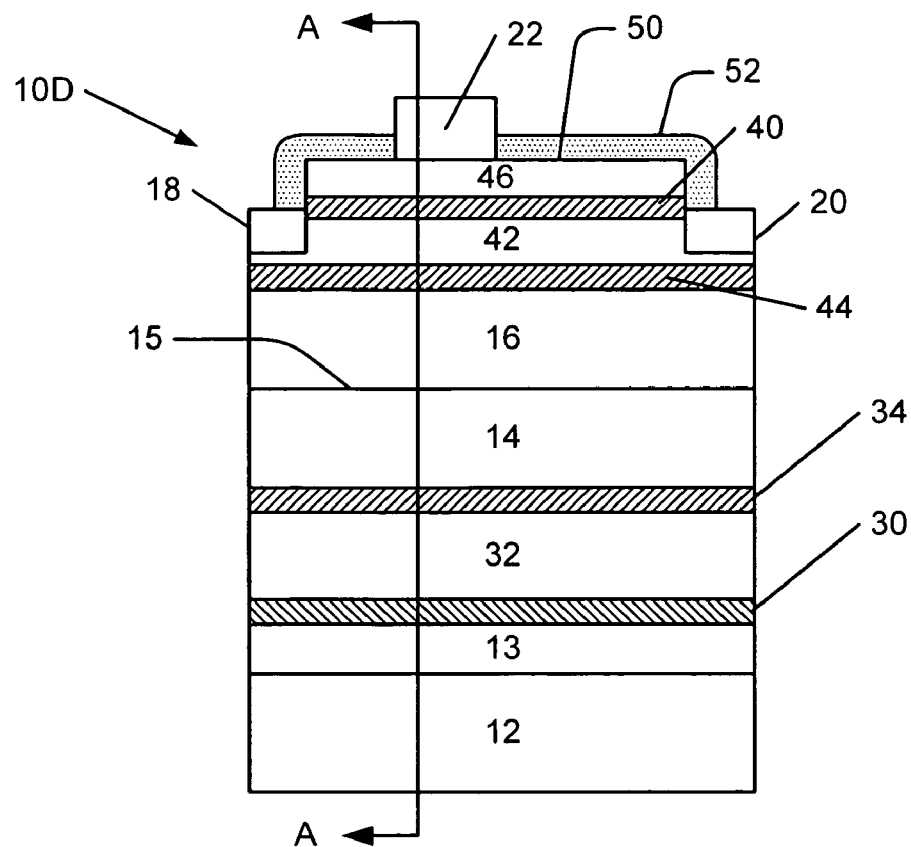
FIG. 10 is a schematic drawing showing a transistor structure according to further embodiments of the present invention.

In order to form effective source and drain ohmic contacts 18, 20 it may be desirable to recess the contacts, for example by etching through the hole source layer 40, the high field layer 42 and the electron source layer 44 to expose a surface of barrier layer 16 prior to metallization as illustrated in FIG. 6. Alternatively, in certain embodiments of the present invention, the etch extends only into high field layer 42 or electron source layer 44 prior to metallization as shown in FIGS. 10 and 8 respectively. The exposed surface may also be implanted with ions to provide a better surface for forming an ohmic contact.

Figure 7:
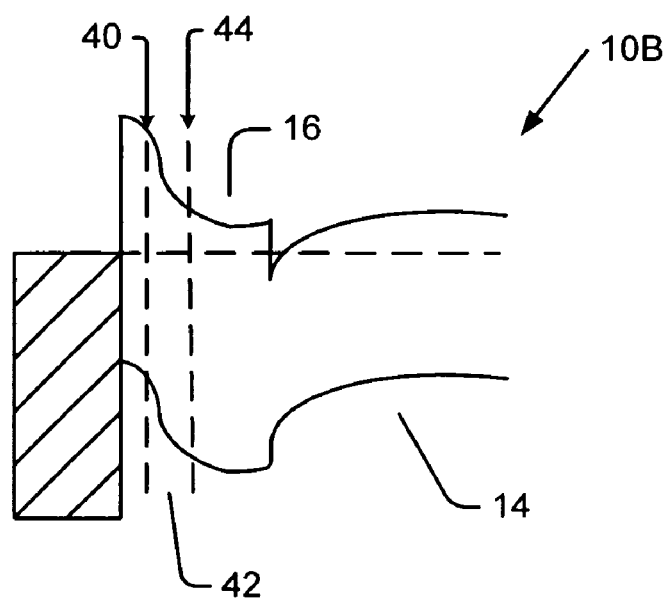
FIG. 7 is an illustrative graph of the band diagram of a region within the embodiments illustrated in FIG. 6.

An illustrative band diagram for the structure of FIG. 6 is shown in FIG. 7. As illustrated in FIG. 7, a high field region 42, characterized by a steep negative slope of the conduction band, is formed between an electron source layer 44 and a hole source layer 40 in a device 10B. The electric field within the high field region opposes the movement of carriers away from the channel layer 14 towards the surface 50 of the device 10B.

As with the embodiments illustrated in FIG. 4, the hole source layer 40 may be provided by a heterojunction interface between the high-field layer and a higher-bandgap layer. Such an embodiment is illustrated in FIG. 8 in which an electron source layer 44 is formed on the barrier layer 16. A high field layer 42 is formed on the electron source layer 44 and a layer 48 having a narrower bandgap than the high field layer 42 forms an abrupt or graded heterojunction with the high field layer 42. The lower band-gap layer 48, which may include $Al_xGa_{1-x}N$ ($0 \leq x \leq 1$), may be undoped or lightly doped with p-type dopants. Accordingly, when the layers are formed, the region near the heterointerface between layers 48 and 42 is induced to act as a hole source due to spontaneous and piezoelectric polarization charge. Thus, even though the structure does not include a highly p-doped layer, a quasi-p-type region 40 is induced at the interface between layers 42 and 48 which serves as a hole source region.

Figure 9:
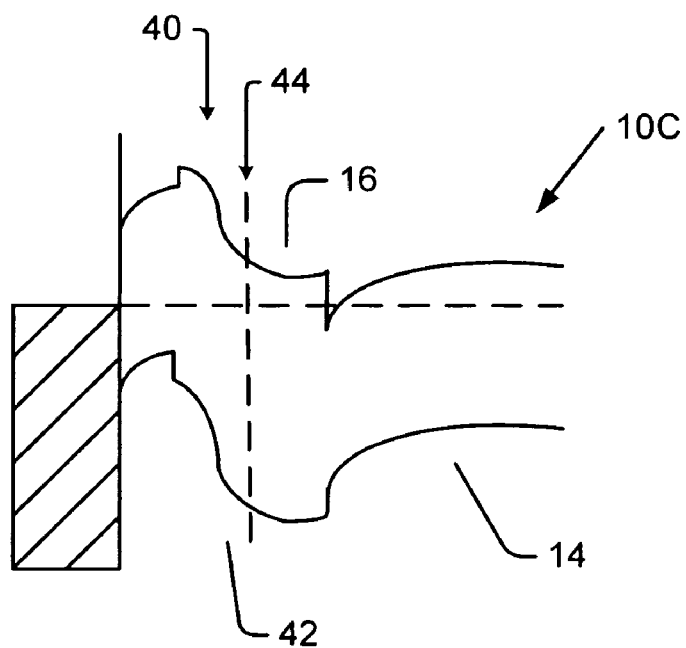
FIG. 9 is an illustrative graph of the band diagram of a region within the embodiments illustrated in FIG. 8.

An illustrative band diagram of the device 10C is shown in FIG. 9. As illustrated in FIG. 9, a high field region 42 is formed due to charge transfer between electron source layer 44 and hole source region 40 that is induced at the interface between layers 42 and 48.

Figure 11:
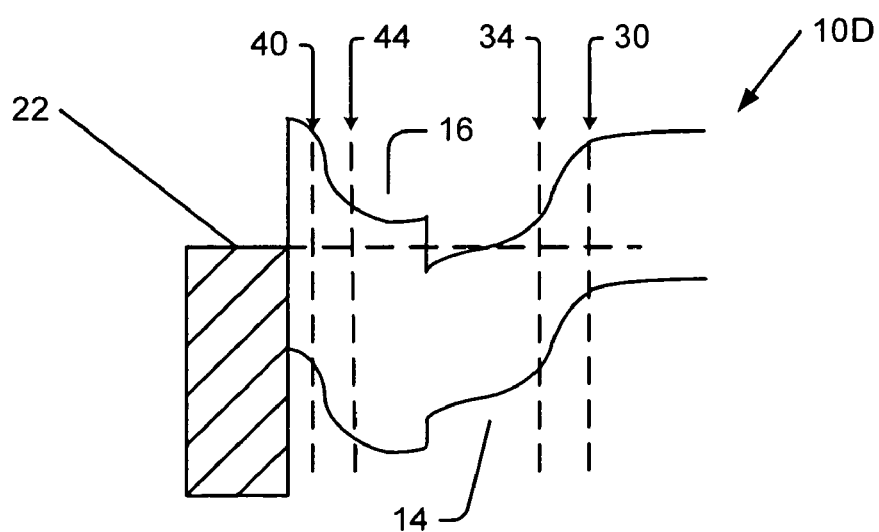
FIG. 11 is an illustrative graph of the band diagram of a region within the embodiments illustrated in FIG. 10.

The carrier confining potential barriers described with reference to FIGS. 1 through 9 above may be provided in the same device to provide confinement of carriers both above and below the channel region of the device. An exemplary structure is shown in FIG. 10. Device structure 10D includes a potential barrier below the channel layer 14 (i.e. between channel layer 14 and buffer layer 13) formed by the electron source layer 34 and the hole source layer 30 as well as a potential barrier above the channel layer 14 (i.e. between the barrier layer 16 and the upper surface 50 of the device 10D) formed by the electron source layer 44 and the hole source layer 40. An illustrative band diagram for the structure of device 10D is shown in FIG. 11. As is evident from FIG. 11, large potential barriers are formed on both sides of the channel layer to oppose the movement of carriers away from the channel region in either direction. As with the embodiments described above, the hole source layers 30, 40 could be formed as thin layers doped with high concentrations of acceptors or they could be induced at heterojunction interfaces as described in connection with the embodiments of FIGS. 8 and 4.

Figure 12:
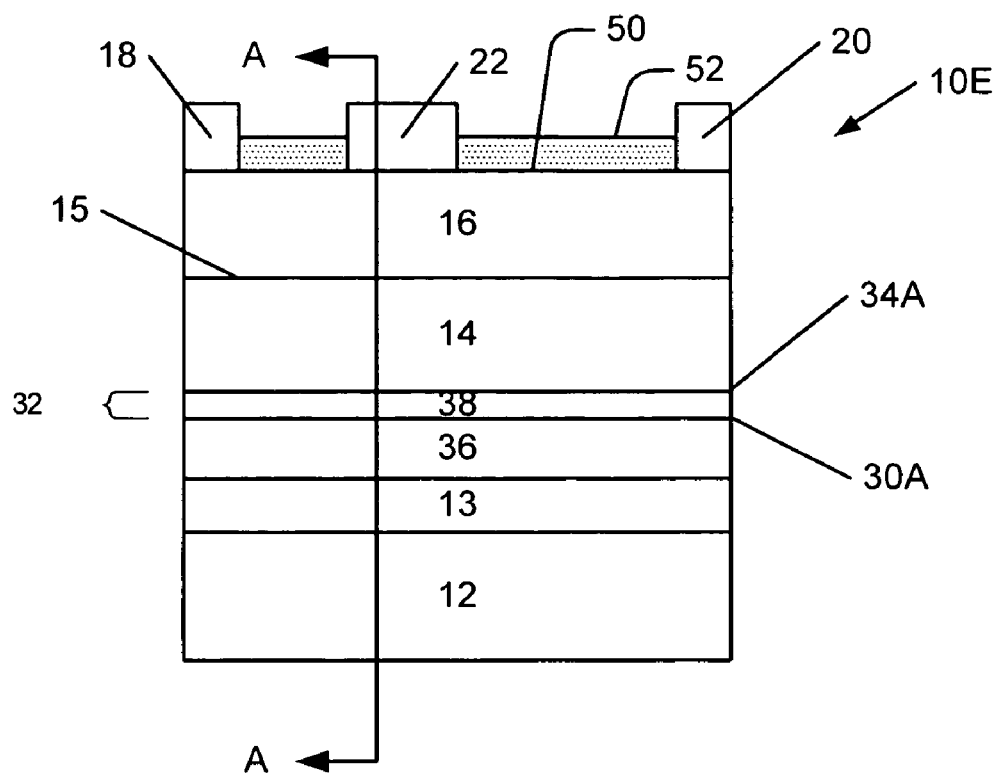
FIG. 12 is a schematic drawing showing a transistor structure according to further embodiments of the present invention.

Other embodiments of the present invention are illustrated in FIG. 12. As described in connection with structure 10 of FIG. 1, structure 10E of FIG. 12 includes a substrate 12, a buffer layer 13, a channel layer 14 and a barrier layer 16 which are formed as described above in connection with FIG. 1. Structure 10E further includes interface regions 30A and 34A between which a quantum well is formed. In structure 10E, the first layer 38 has a narrower band gap and larger lattice constant than the channel layer 14 and the second layer 36 so as to provide a quantum well that provides the barrier. In particular embodiments of the present invention, the first layer 38 is InN and the channel layer 14 and second layer 36 are GaN. For an InN first layer 38, the layer may be approximately 1 monolayer thick (~3 Å). The charge anticipated with an InN/GaN interface is expected to be very high (>2E14 $cm^{-2}$), so no more than ~2 monolayers would be desired for a large barrier. The interfaces 30A and 34A are the hole and electron source regions, respectively, each posessing this very large charge density. Therefore, a very thin layer 38 is capable of producing a large barrier as previously described. Also, the InN layer should be kept thin enough so that there are no allowed energy levels formed within the quantum well that may act as electron or hole traps. Accordingly, for a GaN/InN/GaN structure, the InN should be kept below ~2 monolayers for this reason. For a GaN/InGaN/GaN (or AlGaN/GaN/AlGaN or other InAlGaN/InAlGaN/InAlGaN) structure for a given barrier, the thickness would need to be increased approximately linearly as the band offset is decreased, but the maximum allowable thickness for forbidding quantum levels within the well scales only approximately as the square root—therefore a large discontinuity in band gap may be desirable. Interface regions 30A and 34A may each be either abrupt or graded.

In certain of the embodiments illustrated in FIG. 12, the channel layer 14 may be a thin layer (~30–300 Å)—just thick enough to contain the 2DEG and allow enough thickness to switch to high quality GaN during the growth. In embodiments where the layer 38 is InN, to keep the InN from decomposing during heating up to the subsequent GaN growth temperatures, MBE or high pressure MOCVD may be utilized rather than conventional reduced pressure MOCVD.

Figure 13:
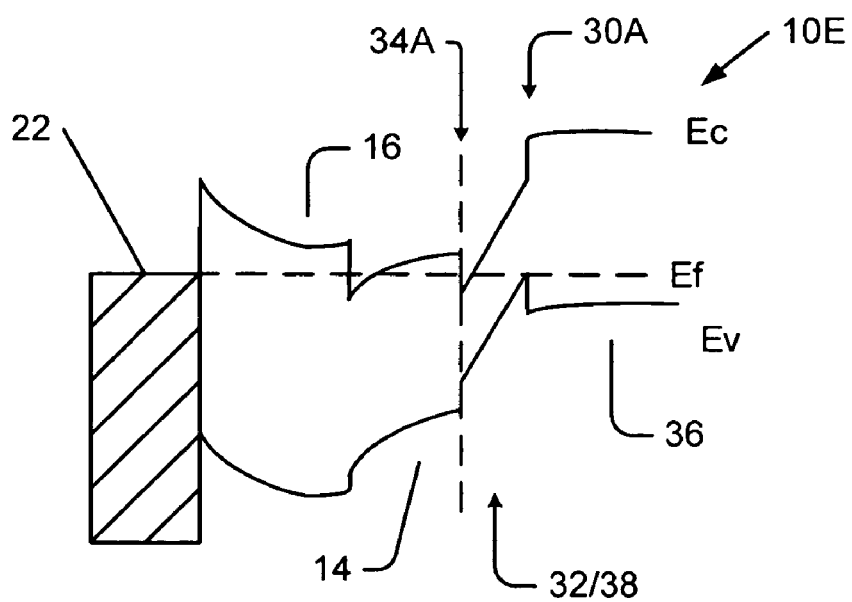
FIG. 13 is an illustrative graph of the band diagram of a region within the embodiments illustrated in FIG. 12.
Figure 14:
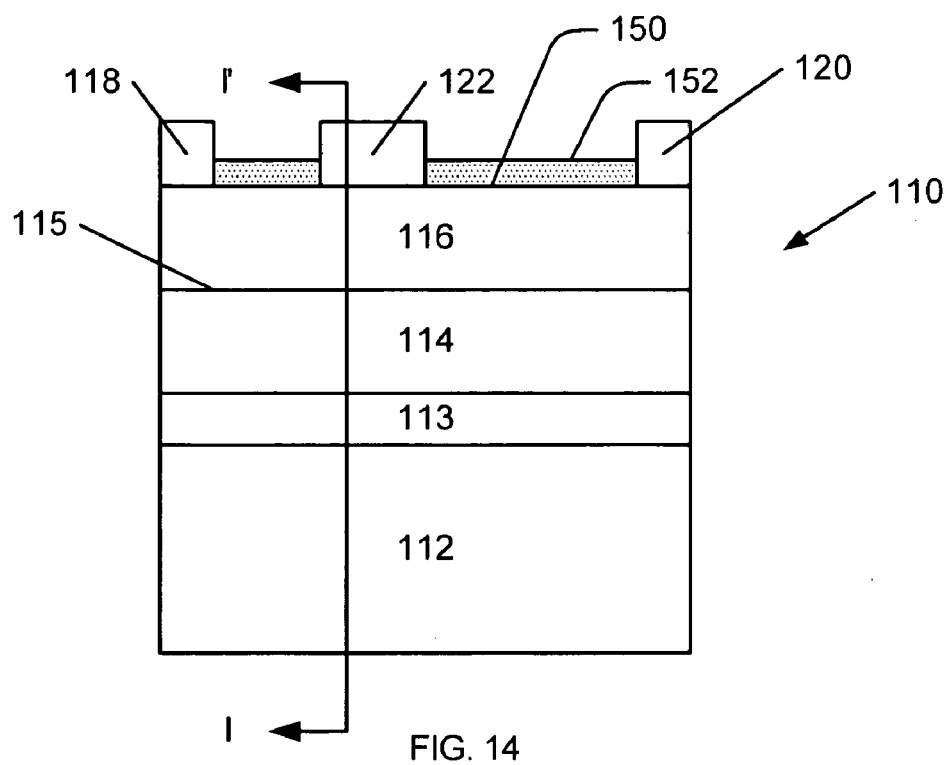
FIG. 14 is a schematic diagram of a prior art HEMT structure.
Figure 15:
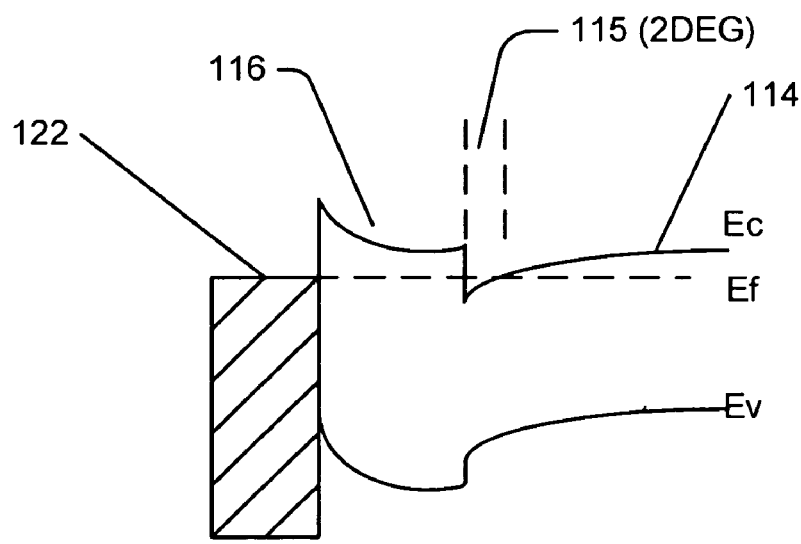
FIG. 15 is an illustrative graph of the band diagram of a region within the structure illustrated in FIG. 14.

An illustrative band diagram for the structure of FIG. 12 is shown in FIG. 13. As illustrated in FIG. 13, a high field region 32, characterized by a steep positive slope of the conduction band, is formed by the quantum well provided by channel layer 14, the first layer 38 and the second layer 36. The electric field within the high field region 32 opposes the movement of carriers away from channel layer 14.

Embodiments of the present invention illustrated in FIG. 12 provide a GaN/InGaN/GaN (including GaN/InN/GaN) structure and, therefore, may provide a channel that is a binary for reduced alloy scattering. Furthermore, the GaN layer 36 may be easier to grow than ternary or quaternary materials, so a thicker, lower dislocation density layer could be made, particularly if GaN substrates become available for use. Furthermore, the electron source and hole source layer densities at interfaces should be approximately equal and cancel, thus, potentially making design easier.

Method embodiments of the present invention are illustrated in FIGS. 16–18. As illustrated in FIG. 16, a method according to embodiments of the present invention includes forming a channel region (block 210) and forming an energy barrier that opposes the movement of carriers away from the channel region (block 215). Some embodiments of the invention include forming a channel region and forming an energy barrier that opposes the movement of carriers away from the channel region on each side of the channel region.

In some embodiments illustrated in FIG. 17, forming an energy barrier includes forming an electron source layer (block 220), forming a high field region (block 230) and forming a hole source layer (block 240). In some embodiments, the channel layer may be formed on the electron source layer. In other embodiments, the electron source layer may be formed after formation of the channel layer.

In particular embodiments illustrated in FIG. 18, a hole source layer is formed (block 225), a high field region is formed on the hole source layer (block 235), and an electron source layer is formed on the high field region (block 245). A channel layer is formed on the electron source layer (block 255). For HEMT structures, a barrier layer may be formed on the channel layer in order to facilitate generation of a 2DEG region between the channel layer and the barrier layer.

In other embodiments, a channel layer is formed, an electron source layer is formed on the channel layer, a high field region is formed on the electron source layer and a hole source layer is formed on the high field region.

The steps of forming a channel layer, forming an electron source layer, forming a high field region and forming a hole source layer are described in detail above. In particular, the step of forming an electron source layer may include delta-doping a thin layer of a nitride-based crystal with donor (n-type) impurities. For example, as discussed above, an electron source layer may be formed by doping a semiconductor crystal with a concentration of dopant atoms of about $10^{18}$ $cm^{-3}$ for a thickness of about 10 nm. Similarly, the step of forming a hole source layer may include delta-doping a thin layer of a nitride-based crystal with acceptor (p-type) impurities. As discussed above, the electron and hole source layers may be formed thicker or thinner than 10 nm. Moreover, the electron and hole source layers do not have to have the same thickness and/or doping levels.

Instead of forming an intentionally doped layer, the step of forming an electron source layer may be accomplished simultaneously with the formation of a 2DEG at a GaN/AlGaN interface. That is, the 2DEG region may act as the electron source layer for purposes of certain embodiments. Similarly, the step of forming a hole source layer may be accomplished by the formation of a heterointerface that acts as an acceptor-doped region due to piezoelectric effects as discussed above.

Exemplary embodiments described herein having heterostructures as a hole or electron source are illustrated with respect to Ga-polar epitaxial layers. For exemplary embodiments relying on doping to provide a hole and/or source layer, such structures would be the same for non-polar or partially Ga polar. However, typically, non-polar structures would not be able to take advantage of heterointerface polarization doping. Embodiments of the present invention employing N-polar structures would look different in terms of the heterostructure layers, although the same principles apply, just reversed.

In the drawings and specification, there have been disclosed typical embodiments of the invention, and, although specific terms have been employed, they have been used in a generic and descriptive sense only and not for purposes of limitation, the scope of the invention being set forth in the following claims.

That which is claimed is:

1. A nitride-based HEMT capable of high-frequency operation comprising:
a substrate;
a channel layer comprising InAlGaN on the substrate;
a barrier layer comprising InAlGaN on the channel layer, the barrier layer having a bandgap greater than a bandgap of the channel layer, the barrier layer and the channel layer cooperatively inducing a two-dimensional electron gas at an interface between the channel layer and the barrier layer;
at least one energy barrier adjacent one of the barrier layer and/or the channel layer, the energy barrier comprising a fully depleted, delta doped electron source layer in proximity with and spaced apart from a fully depleted, delta doped hole source layer by a high field region.

2. A HEMT according to claim 1, wherein the electron source layer comprises a layer doped with n-type dopants.

3. A HEMT according to claim 1, wherein the hole source layer comprises a layer doped with p-type dopants.

4. A HEMT according to claim 1, wherein the hole source layer comprises a layer co-doped with deep-level transition elements and shallow acceptor dopants.

5. A HEMT according to claim 1, wherein the hole source layer comprises a layer doped with deep-level acceptor dopants.

6. A HEMT according to claim 1, wherein the energy barrier provides a built-in potential barrier in excess of about 0.5V.

7. A HEMT according to claim 1, wherein the energy barrier provides a built-in potential barrier in excess of about 1V.

8. A HEMT according to claim 1, wherein the energy barrier provides a built-in potential barrier in excess of about 2V.

9. A HEMT according to claim 1, wherein the energy barrier has an associated electric field directed away from the channel.

10. A HEMT according to claim 1, wherein the energy barrier arises due to charge transfer between the electron source layer and the hole source layer.

11. A HEMT according to claim 1, wherein the energy barrier has a peak electric field in excess of about $10^5$V/cm.

12. A nitride-based HEMT capable of high-frequency operation comprising:
a substrate;
a channel layer comprising $Al_xGa_{1-x}N$ ($0 \leq x \leq 1$) on the substrate;
a barrier layer comprising $Al_yGa_{1-y}N$ ($0 < y \leq 1$) on the channel layer, the barrier layer having a bandgap greater than a bandgap of the channel layer, the barrier layer and the channel layer cooperatively inducing a two-dimensional electron gas at an interface between the channel layer and the barrier layer; and
at least one energy barrier in the barrier layer, the energy barrier comprising a fully depleted, delta doped electron source layer in proximity with and spaced apart from a fully depleted, delta doped hole source layer by a high field region and opposing the movement of electrons away from the channel layer.

13. A nitride-based HEMT capable of high-frequency operation comprising:
a substrate;
a channel layer comprising $Al_xGa_{1-x}N$ ($0 \leq x \leq 1$) on the substrate;
a barrier layer comprising $Al_yGa_{1-y}N$ ($0 < y \leq 1$) on the channel layer, the barrier layer having a bandgap greater than a bandgap of the channel layer, the barrier layer and the channel layer cooperatively inducing a two-dimensional electron gas at an interface between the channel layer and the barrier layer;
at least one energy barrier between the two-dimensional electron gas and the substrate, the energy barrier comprising a fully depleted, delta doped electron source layer in proximity with and spaced apart from a fully depleted, delta doped hole source layer by a high field region and opposing the movement of electrons away from the interface between the barrier layer and the channel layer.

14. A field effect transistor comprising:
a substrate;
a channel layer comprising InAlGaN on the substrate;
source and drain ohmic contacts in electrical communication with the channel layer;
a gate contact on the channel layer;
at least one energy barrier between the channel layer and the substrate, the energy barrier comprising a fully depleted, delta doped electron source layer in proximity with and spaced apart from a fully depleted, delta doped hole source layer by a high field region.

15. A field effect transistor comprising:
a substrate;
a buffer layer on the substrate
a channel layer comprising InAlGaN on the buffer layer;
source and drain ohmic contacts in electrical communication with the channel layer;
a gate contact on the channel layer;
a fully depleted, delta doped electron source layer between the channel and the buffer;
a fully depleted, delta doped hole source layer between the electron source layer and the buffer;
a high field region between the electron source layer and the hole source layer, the high field region providing an energy barrier opposed to the movement of electrons away from the channel layer toward the buffer.

16. A nitride-based HEMT capable of high-frequency operation comprising:
a Group III-nitride based channel layer on a substrate;
a Group III-nitride based barrier layer on the channel layer, the barrier layer having a bandgap greater than a bandgap of the channel layer, the barrier layer and the channel layer cooperatively inducing a two-dimensional electron gas at an interface between the channel layer and the barrier layer; and
a quantum well adjacent the channel layer and configured to generate a built-in potential that opposes movement of carriers away from the channel layer, wherein the quantum well comprises:
a first nitride layer adjacent the channel layer, the first nitride layer having a band gap that is narrower than a band gap of the channel layer and a lattice constant that is larger than a lattice constant of the channel layer; and
a second Group III-nitride based layer adjacent the first nitride layer and opposite the channel layer, the second Group III-nitride based layer having a band gap and a lattice constant that are substantially the same as the band gap and lattice constant of the channel layer.

17. The nitride-based HEMT of claim 16, wherein the first nitride layer comprises InN and the channel layer and second Group III-nitride based layer comprise GaN.

18. The nitride-based HEMT of claim 16, wherein the first nitride layer has a thickness of about one or two monolayers.

19. The nitride-based HEMT of claim 16, wherein the channel layer has a thickness of from about 30 Å to about 300 Å.

* * * * *

UNITED STATES PATENT AND TRADEMARK OFFICE
CERTIFICATE OF CORRECTION

| | | |
|---|---|---|
| PATENT NO. | : 7,170,111 B2 | Page 1 of 1 |
| APPLICATION NO. | : 10/772882 | |
| DATED | : January 30, 2007 | |
| INVENTOR(S) | : Saxler | |

It is certified that error appears in the above-identified patent and that said Letters Patent is hereby corrected as shown below:

<u>Column 11,</u>

Line 11: Please correct "Ed" to read --$E_d$--

Signed and Sealed this

First Day of May, 2007

JON W. DUDAS
*Director of the United States Patent and Trademark Office*